(12) United States Patent
Uemoto et al.

(10) Patent No.: US 7,696,527 B2
(45) Date of Patent: Apr. 13, 2010

(54) LIGHT SOURCE, MANUFACTURING METHOD OF LIGHT SOURCE, LIGHTING APPARATUS, AND DISPLAY APPARATUS

(75) Inventors: Takaari Uemoto, Osaka (JP); Hiroyuki Naito, Osaka (JP)

(73) Assignee: Panasonic Corporation, Osaka (JP)

( * ) Notice: Subject to any disclaimer, the term of this patent is extended or adjusted under 35 U.S.C. 154(b) by 66 days.

(21) Appl. No.: 11/631,583

(22) PCT Filed: Jul. 26, 2005

(86) PCT No.: PCT/JP2005/013997

§ 371 (c)(1),
(2), (4) Date: Sep. 29, 2008

(87) PCT Pub. No.: WO2006/013880

PCT Pub. Date: Feb. 9, 2006

(65) Prior Publication Data

US 2009/0039376 A1 Feb. 12, 2009

(30) Foreign Application Priority Data

Aug. 6, 2004 (JP) .............................. 2004-231231
Jul. 12, 2005 (JP) .............................. 2005-203062

(51) Int. Cl.
H01L 33/38 (2010.01)
(52) U.S. Cl. .................. 257/99; 257/E33.065; 438/26; 438/108

(58) Field of Classification Search .................. 257/91, 257/99, E33.062, E33.063, E33.065, E33.066; 438/28, 120, 26, 108
See application file for complete search history.

(56) References Cited

U.S. PATENT DOCUMENTS

| 6,486,499 B1 | 11/2002 | Krames et al. | |
|---|---|---|---|
| 2003/0147333 A1* | 8/2003 | Tokuda et al. | 369/121 |
| 2004/0061123 A1* | 4/2004 | Shelton et al. | 257/99 |

FOREIGN PATENT DOCUMENTS

| JP | 8-037357 | 2/1996 |
|---|---|---|
| JP | 2005-117035 | 4/2005 |

* cited by examiner

*Primary Examiner*—Minh-Loan T Tran
*Assistant Examiner*—W. Wendy Kuo

(57) ABSTRACT

Provided is a light source that has high reliability and hardly causes conductivity failure between a light emitting device and a conductive land. In an LED light source of the present invention, an LED bare chip is mounted to conductive lands of a substrate, using bumps ($55a$, $55b$). The LED bare chip ($D65$) is provided with a p-electrode ($Lp$) and an n-electrode ($Ln$) on a rear surface. The p-electrode ($Lp$) is larger in area than the n-electrode ($Ln$). The p-electrode ($Lp$) is bonded to a corresponding conductive land via four bumps ($55a$), whereas the n-electrode ($Ln$) is bonded to a corresponding conductive land via one bump ($55b$). A bonded area ($Sn$) between the n-electrode ($Ln$) and the bump ($55b$) is larger than a bonded area ($Sp$) between the p-electrode ($Lp$) and one of the bumps ($55a$).

20 Claims, 14 Drawing Sheets

LIGHT SOURCE, MANUFACTURING METHOD OF LIGHT SOURCE, LIGHTING APPARATUS, AND DISPLAY APPARATUS

TECHNICAL FIELD

The present invention relates to a light source in which a light-emitting device, which has two electrodes on the rear surface, is mounted to a conductive land of a substrate via a plurality of bumps, and to a manufacturing method of the light source. The present invention also relates to a lighting apparatus and a display apparatus that employ the light source.

BACKGROUND ART

In recent years, light-emitting diode bare chips (hereinafter "LED bare chip") are attracting attention, further high efficiency and long life compared to incandescent lamps and halogen lamps. Furthermore, with their small size, the LED bare chips are expected to realize small light sources.

One example of light source realized using such LED bare chips is disclosed in Japanese laid-open patent application H08-37357. In the disclosed light source, an LED bare chip, which has two electrodes on the rear surface, is mounted to a conductive land of a substrate via a plurality of bumps.

The trend in recent years is to have a larger area for a p-electrode than for an n-electrode, so as to enhance light extraction efficiency from LED bare chips. In addition, a p-electrode tends to be bonded to a conductive land via a plurality of bumps, whereas an n-electrode is bonded to a conductive land via one bump.

FIG. 1 shows an overall view of a conventional light source in which an LED bare chip is mounted to a conductive land via bumps.

In an LED bare chip 9D, its p-electrode is bonded to a conductive land 943a, via four bumps 955a, 955b, 955c, and 955d (see broken lines) and its n-electrode is bonded to a conductive land 943b via one bump 955e (see a broken line).

In such a light source, whether the LED bare chip 9D is mounted to the conductive lands 943a and 943b has been tested in the following way. Shearing force with a predetermined load is exercised onto the LED bare chip 9D after mounting, to see whether the LED bare chip 9D comes off from the conductive lands 943a and 943b. To be more specific, when the LED bare chip 9D does not come off even by a predetermined load of shearing force, it is considered that the LED bare chip 9D is bonded to the conductive land 943a and 943b, via the bumps. 955a, 955b, 955c, 955d, and 955e, and that the LED bare chip 9D is in electrical connection with the conductive lands 943a and 943b.

However, even for a light source for LED that has passed the test, with years of use, its LED bare chips may stop lighting up, due to conductivity failure between the LED bare chips and the bumps, or between the bumps and the conductive lands.

This is because of the following characteristics of the conventionally performed test. The predetermined load used in the test is determined assuming that all the bumps have been uniformly bonded with an average strength. Therefore, if four out of five bumps are more firmly bonded than an average strength and the remaining one bump is very weakly bonded, it is still possible to obtain the targeted level of bonding in total.

In such a case, the bump in very weak bonding has a possibility of coming off with years of use. If this bump in such weak bonding is one of the four bumps on the p-electrode, it hardly exercises any effect on the conductivity. However, if this bump is on the n-electrode, it is quite likely to cause conductivity failure between the LED bare chip and the conductive lands, leading to non-lighting of the LED bare chip.

Note that, although with a lower possibility, this problem pertaining to the conductivity failure also arises in a case where more than one bump is used with respect to an n-electrode.

DISCLOSURE OF THE INVENTION

The object of the present invention is to provide, without necessitating change of the conventionally performed test, a light source, a manufacturing method of the light source, a lighting apparatus or a display apparatus that employs the light source, which have high reliability and hardly cause conductivity failure between a light emitting device and a conductive land.

So as to achieve the above object, the light source of the present invention has: at least one light emitting device, a rear surface of which is provided with two electrodes that differ from each other in area; a substrate having conductive lands formed in correspondence with the electrodes; and a plurality of bumps, each of which exists between a corresponding one of the electrodes and a corresponding one of the conductive lands, and has a first portion bonded to the corresponding electrode and a second portion bonded to the corresponding conductive land, where the electrode being larger in area is bonded by a greater number of bumps than the electrode being smaller in area, and a bump having the smallest portion in area of all first and second portions of the plurality of bumps exists on the larger-area electrode.

Here, "light emitting device" is a concept that includes a light emitting diode and a laser diode. In addition, "substrate" includes both of a main-substrate for mounting thereon a plurality of light emitting devices, and a sub-substrate for mounting thereon only one light emitting device. Moreover, the substrate should be neither limited by a material such as resin, ceramic, and metal, nor limited by a particular manufacturing method.

In addition, the number of bumps used to bond the smaller-area electrode should not be particularly limited. For example, the smaller-area electrode may be bonded via only one bump, or via a plurality of bumps, as long as the number of bumps is different between the electrodes.

In the light source, the bump having the smallest portion in area of all the first and second portions of the plurality of bumps never exists on the smaller-area electrode. Therefore, compared to a conventional light source where a bump having the smallest portion in area of all the first and second portions of the plurality of bumps may be used to bond the smaller-area electrode to a corresponding conductive land, bonding force between the smaller-area electrode and a corresponding conductive land is enhanced, thereby reducing the possibility of causing non-lighting of the light emitting device.

In particular, in a case where the smaller-area electrode and a conductive land is bonded by only one bump, the bump having the smallest portion in area of all the first and second portions of the plurality of bumps never exists on the smaller-area electrode. In other words, a bonded area of a smaller one of first and second portions of the bump bonding the smaller-area electrode is always larger than the smallest bonded area of the bumps bonding the larger area electrode. Accordingly, even if the number of bumps used to bond the smaller-area electrode is small, it is possible to enhance the bonding reliability of the smaller-area electrode. In addition, the conductivity reliability of the smaller-area electrode is enhanced as well.

In the description, an expression "a bonded area of a bump with (or used for) an electrode" represents an area of a portion of the bump, the portion being bonded to the electrode. Likewise, an expression "a bonded area between a bump and an electrode" represents an area of a bonded portion between the bump and the electrode. This also applies to all similar expressions used in the present description.

In addition, the present invention may have a structure in which there is at least one bump having the largest portion in area of either the first portions or the second portions of the plurality of bumps, the either the first portions or the second portions including the smallest portion in area of all the first and second portions, and the at least one bump exists on the smaller-area electrode.

In the above expression, "the first portions" represents all the portions of the plurality of bumps, which are bonded to the light emitting device, and "the second portions" represents all the portions of the plurality of bumps, which are bonded to the substrate. In the stated structure, the smaller-area electrode is bonded via at least one bump having the largest portion in area of either the first portions or the second portions, where the either the first portions or the second portions being the side from which it is more likely to cause conductive failure due to its bump coming off, than the other side. Accordingly, it is possible to enhance the bonding reliability of the smaller-area electrode. In addition, the conductivity reliability of the smaller-area electrode is enhanced as well. Therefore, even if only one bump is used to bond the smaller-area electrode, it is still possible to enhance the conductivity reliability.

Here, at least one of first and second portions may be substantially the same in area for all the bumps existing on the larger-area electrode.

Here, only one bump may exist on the smaller-area electrode.

Here, the bumps existing on the larger-area electrode may be arranged substantially in an orderly formation.

Here, a structure is also possible in which all the bumps existing on the larger-area electrode are the same in area within each of the first and second portions, and the largest area of all the first and second portions of the plurality of bumps is at least 1.2 times the area of one of the bumps existing on the larger-area electrode.

According to these structures, it is possible to enhance the bonding reliability.

The lighting apparatus according to the present invention is characterized by including the above-stated light source.

In addition, the display apparatus according to the present invention is characterized by including the above-stated light source.

So as to achieve the above object, the present invention provides a manufacturing method of a light source, in which at least one light emitting device is mounted to conductive lands of a substrate via a plurality of bumps, the light emitting device having two electrodes on a rear surface, where the size of the bumps differs between the electrodes.

In addition, the present invention provides a manufacturing method of a light source, in which at least one light emitting device is mounted to conductive lands of a substrate via a plurality of bumps, the light emitting device having two electrodes on a rear surface, the electrodes differing from each other in area, where the electrode being larger in area is bonded by a greater number of bumps than the electrode being smaller in area, and a bump that is bonded with an electrode and a conductive land in the smallest area among the plurality of bumps is used to bond the larger-area electrode.

Accordingly, a bonded area of a bump that bonds the smaller-area electrode and a conductive land will not be the smallest. Therefore, compared to a conventional light source where the bump that bonds the smaller-area electrode and a corresponding conductive land may be the smallest of all the bumps, bonding force between the smaller-area electrode and a corresponding conductive land is enhanced, thereby reducing the possibility of causing non-lighting of the light emitting device.

Here, only one bump may be used to bond the smaller-area electrode.

Here, the largest one of the bumps may be used to bond the smaller-area electrode.

Here, the bumps used to bond the larger-area electrode may have substantially the same size.

Here, the bumps existing on the larger-area electrode may be arranged substantially in an orderly formation.

Here, a structure is also possible in which the light emitting device is mounted to the conductive lands in ultrasound bonding, and a load exercised to the light emitting device in the ultrasound bonding increases over time.

In the light source according to the present invention, the bump that bonds the smaller-area electrode and a corresponding conductive land will not be the smallest of all the bumps. Therefore, compared to a conventional light source where the bump that bonds the smaller-area electrode and a corresponding conductive land may be the smallest of all the bumps, bonding force between the smaller-area electrode and a corresponding conductive land is enhanced, thereby reducing the possibility of causing non-lighting of the light emitting device.

In particular, in a case where the smaller-area electrode and a conductive land is bonded by only one bump, the bump that is bonded with an electrode and with a conductive land in the smallest area of all the plurality of bumps will never be used to bond the smaller-area electrode. In other words, a bonded area of a bump used for the smaller-area electrode is always larger than a bonded area of the bump having the smallest bonded area among the larger-area electrode. Accordingly, even if the number of bumps used to bond the smaller-area electrode is small, it is possible to enhance the bonding reliability of the smaller-area electrode. In addition, the conductivity reliability of the smaller-area electrode is enhanced as well.

In a case where a bump having the largest bonded area both with an electrode and with a conductive land is used to bond the smaller-area electrode, it is natural that the bonded area of the bump is the largest among all the bumps. Accordingly, even when only the bump is used to bond the smaller-area electrode, it is possible to enhance the conductivity reliability of the smaller-area electrode.

In addition, a bonded area of a bump having the largest bonded area with an electrode and with a conductive land is 1.2 times a bonded area of any of the rest of the bumps, or even more. This leads to enhanced bonding reliability.

On the other hand, according to a manufacturing method of a light source according to the present invention, the size of the bumps differs between the electrodes. Therefore, it is possible to enhance the bonding force between the electrode and the conductive land for the smaller-area electrode, for example by bonding the smaller-area electrode using a bump larger than bumps used to bond the larger-area electrode. This helps reduce the possibility of non-lighting of the light emitting device.

BEST MODE FOR CARRYING OUT THE INVENTION

The following describes an LED light source that uses LED bare chips as light-emitting devices, as a light source according to the present invention, with reference to the drawings.

1. Structure of LED Light Source (A) Overview

Figure 1:
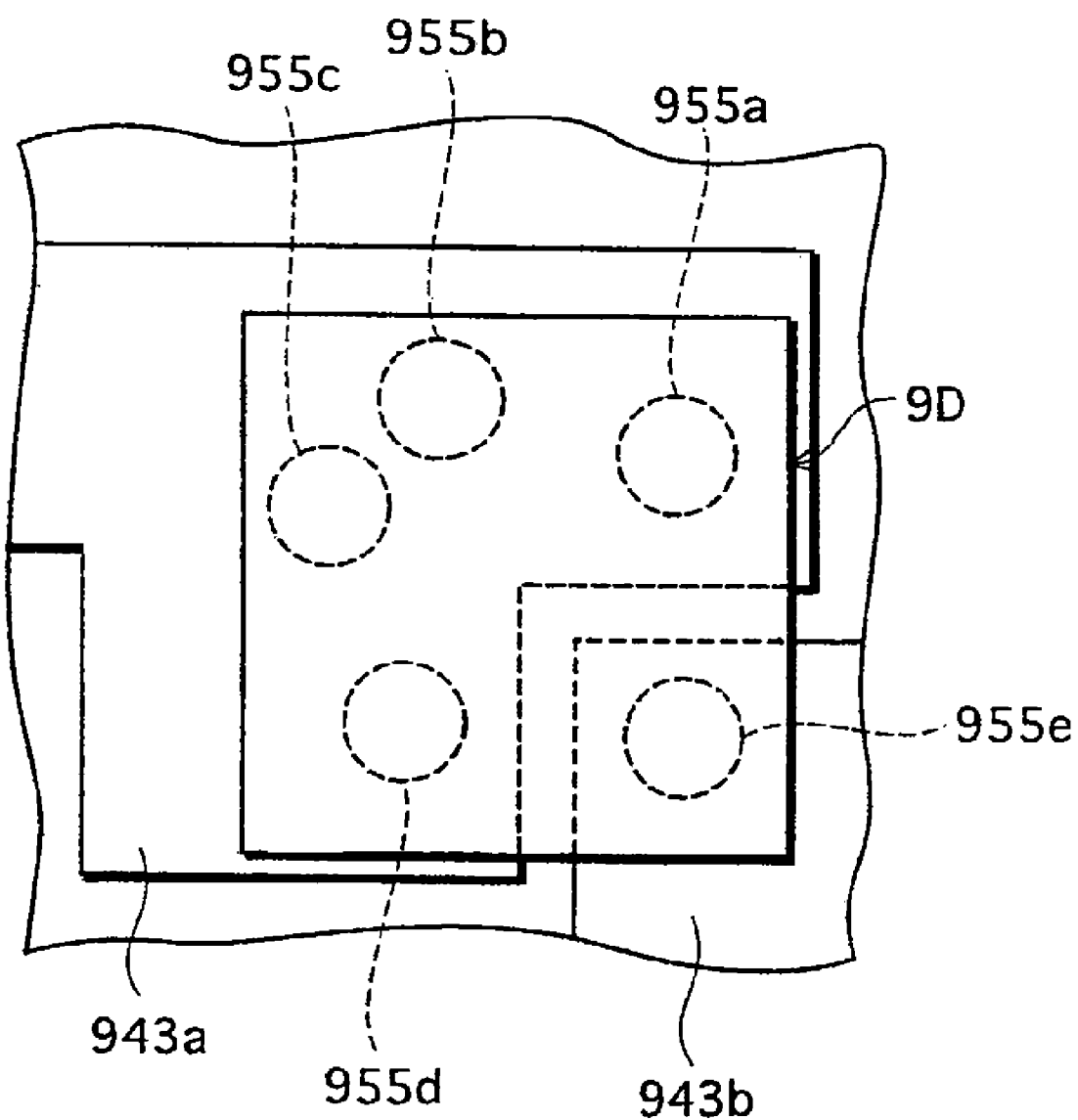
FIG. 1 shows a plan view of a conventional light source in which an LED bare chip 9D is mounted.
Figure 2:
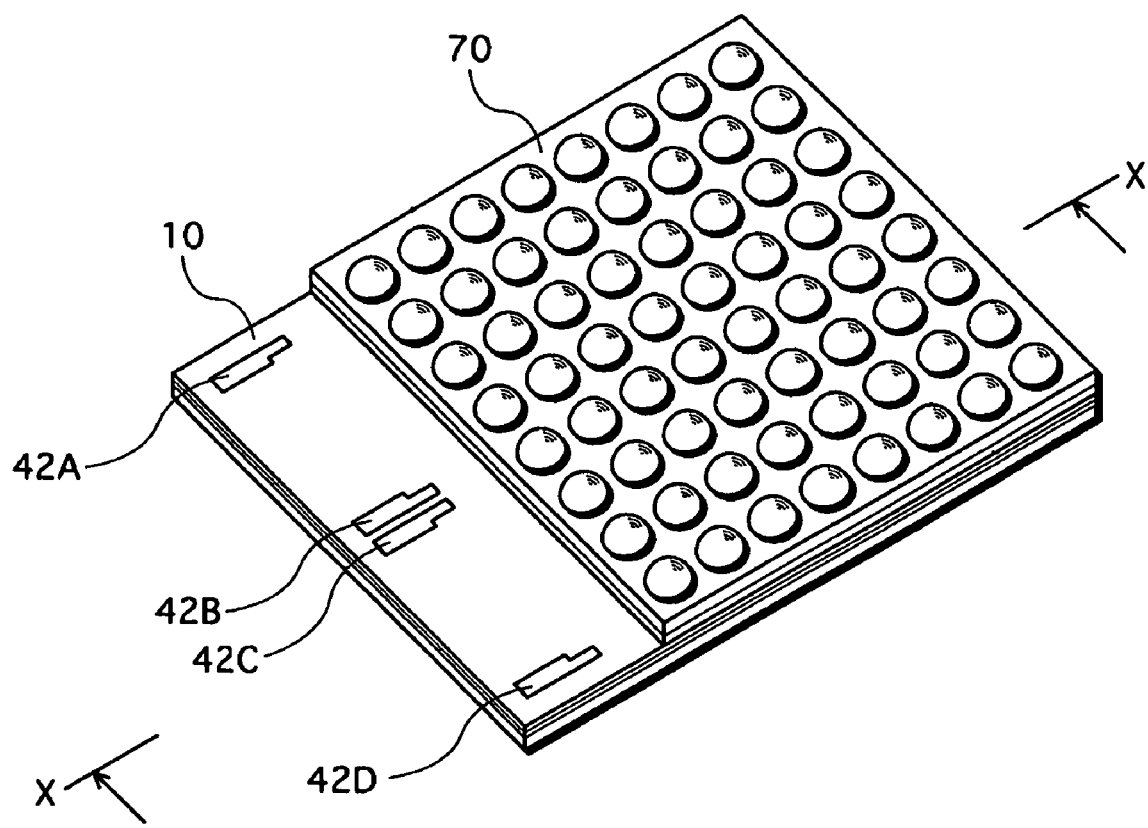
FIG. 2 shows a perspective view of an LED light source according to the present invention.
Figure 3:
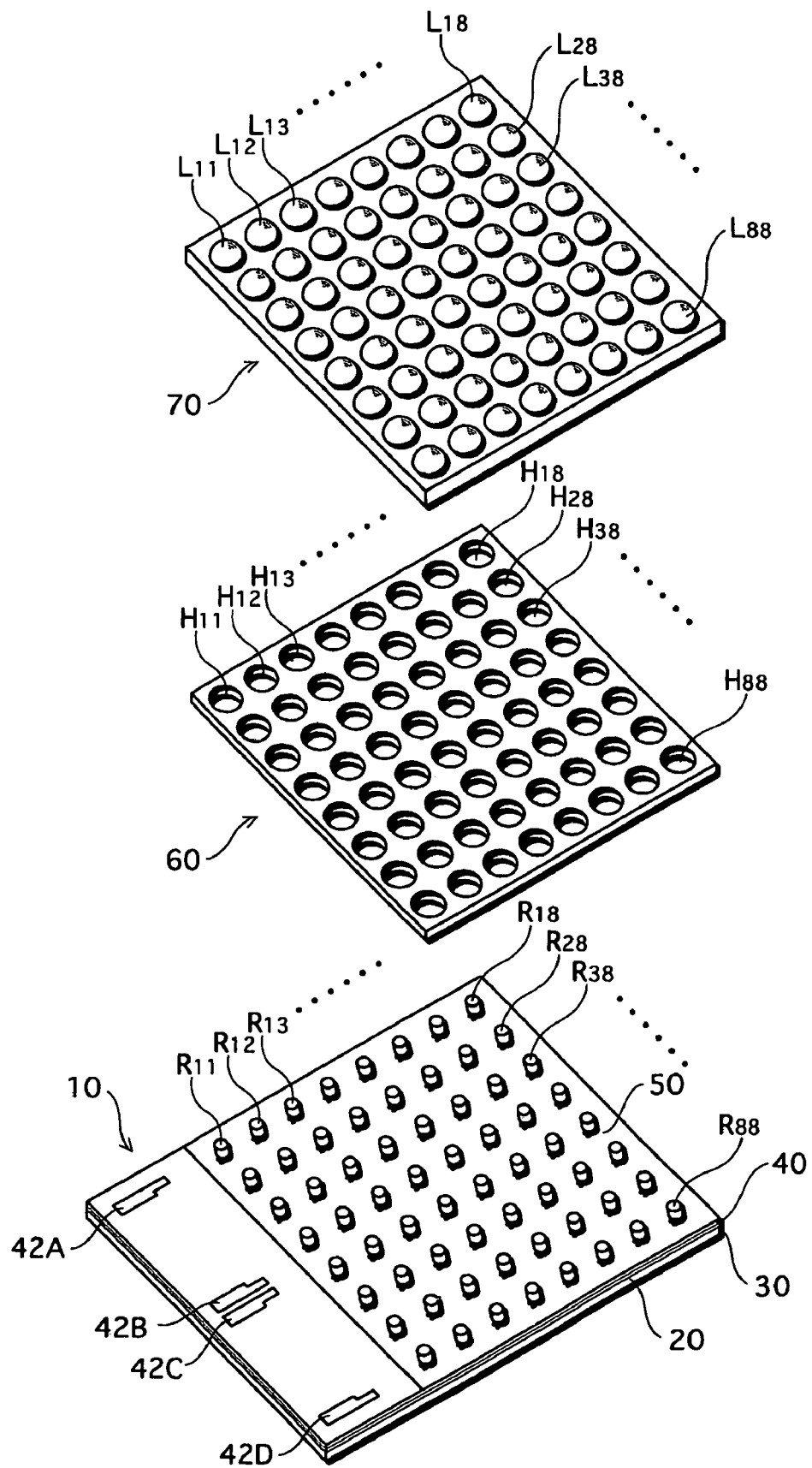
FIG. 3 shows an exploded perspective view of the LED light source.
Figure 4:
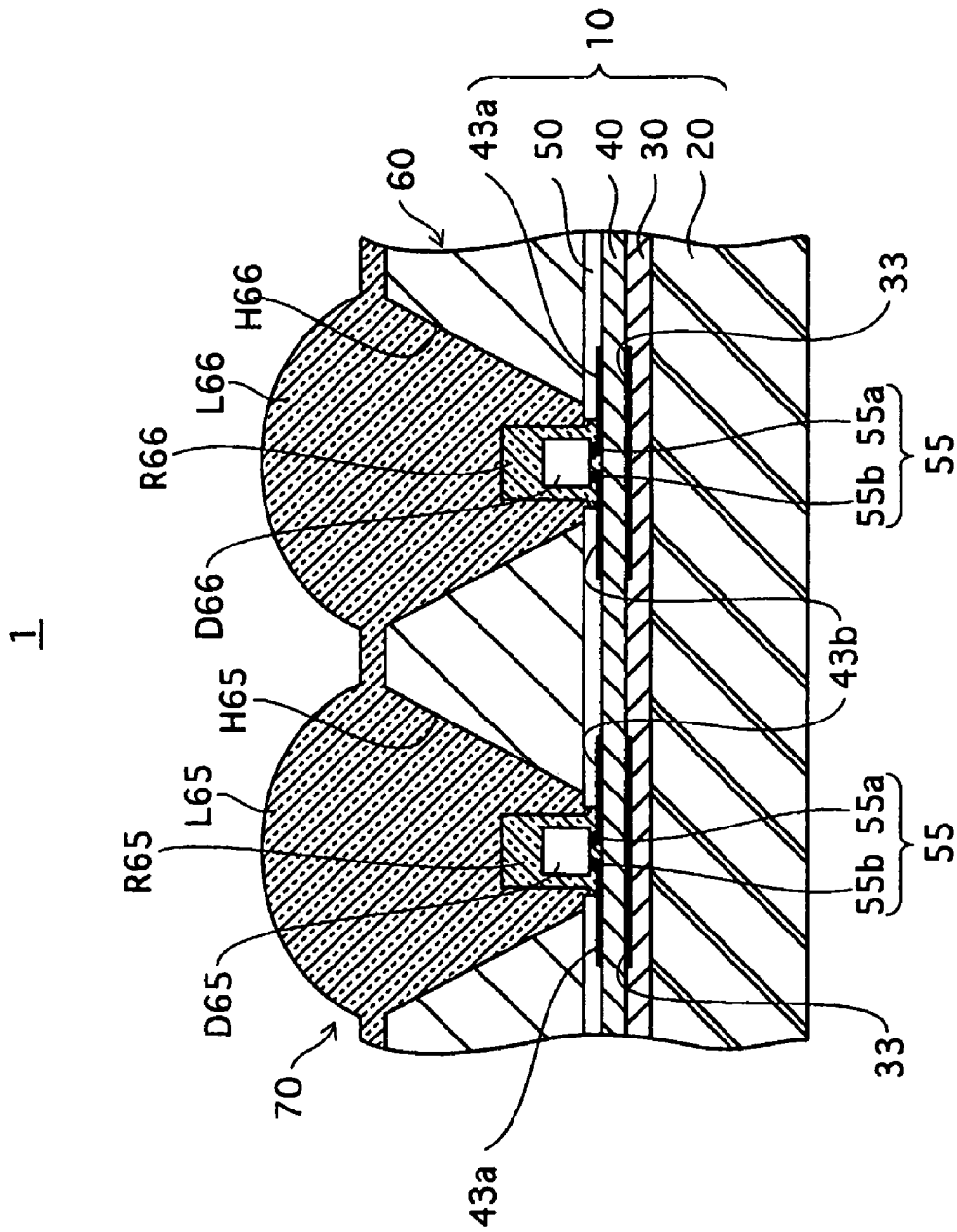
FIG. 4 shows an enlarged view of the longitudinal cross-section cut at the X-X line of FIG. 2, which is seen in the direction of the arrow.

FIG. 2 shows a perspective view of a LED light source, according to the present embodiment. FIG. 3 shows an exploded perspective view of the LED light source. FIG. 4 shows an enlarged view of the longitudinal cross-section cut at the X-X line of FIG. 2, which is seen in the direction of the arrow.

As FIG. 2 and FIG. 3 show, the LED light source has a substrate 10 for mounting a plurality of LED bare chips on its surface; a reflection plate 60 that is attached to the surface a of the substrate and reflects light emitted from the LED bare chips to a predetermined direction; and a lens plate 70 that collects light reflected from the reflection plate 60 into a desired direction. This LED light source 1 is a multiple-point source, in which LED bare chips are aligned on a substrate in a matrix formation, and realizes a surface illuminant by light emission from the LED bare chips.

As shown in FIG. 4, the LED bare chips (D65 and D66) are enclosed by means of resin inclusion bodies (R65 and R66). The resin inclusion bodies are detailed later. It is the resin inclusion bodies (e.g. R11, R12 . . . ) used for enclosing the LED bare chips, which appear on the substrate of FIG. 3 (i.e. the LED bare chips are not directly shown FIG. 3).

As shown in FIG. 3, 64 resin inclusion bodies (corresponding to 64 LED bare chips) are aligned in a matrix formation with 8 rows and 8 columns. Here, a resin inclusion body is shown by a sign "Rnm", where n represents the number of rows, m represents the number of columns, and n and m are integers of 1-8.

The reflection plate 60 is, for example, made of a metal such as aluminum. 64 holes (Hnm) are provided through the reflection plate 60, in position corresponding to the resin inclusion bodies Rnm provided for the substrate 10. Here, n and m in the sign "Hnm", which represents each hole, correspond to n and m in the sign "Rnm" which represents each resin inclusion body. Therefore, n and m in the sign "Hnm" are integers of 1-8, too.

The lens plate 70 is, for example, made of resin or glass. As FIGS. 2 and 3 show, convex lenses "Lnm" are formed on the lens plate 70, in position corresponding to the holes Hnm of the reflection plate 60 (i.e. in position corresponding to the resin inclusion bodies Rnm). Each of the convex lenses is in a dorm-shape. Here, n and m in the sign "Lnm", which represents each convex lens, correspond to n and m in the sign "Hnm" which represents each hole, and to n and m in the sign "Rnm" which represents each resin inclusion body. Therefore, n and m in the sign "Lnm" are integers of 1-8, too.

(B) Details

FIG. 4 shows an enlarged view of the longitudinal cross-section cut at the X-X line of FIG. 2, which is seen in the direction of the arrow. In particular, the portion of FIG. 2 in $6^{th}$ row and $5^{th}$-$6^{th}$ columns is focused and enlarged in FIG. 4.

Hereinafter, when the description involves a particular position of LED bare chip, resin inclusion body, hole, convex lens, and so on, a concrete matrix notation represented by integers is used (e.g. matrix (6,5), or matrix (6,6)). Otherwise, the LED bare chips, the resin inclusion bodies, the holes, the convex lenses, and so on will be represented by a general matrix notation using n and m as above.

As shown in FIG. 3 and FIG. 4, the substrate 10 is a metal base substrate, which is made of two insulation layers 30 and 40, and a metal base 20 attached to a rear surface of the insulation layer 30 positioned at the backside. On each of the insulation layers 30 and 40, a corresponding wiring pattern 33 is formed for supplying power to the LED bare chips D65 and D66.

The two insulation layers 30 and 40 are for example made of a thermosetting resin-containing an inorganic filler. A wiring pattern 33 formed on the surface of the insulation layer 30 is connected to a corresponding wiring pattern 33 formed on the surface of the insulation layer 40, via a via hole, or the like. It should be noted here that the insulation layers may be made of other materials such as ceramic and glass epoxy.

Here, a portion of a wiring pattern 33, on which an LED bare chip Dnm is to be mounted, is referred to as a conductive land 43. In the present embodiment, the substrate 10 is in multi-layer structure that uses two insulation layers 30 and 40 so as to realize high-density mounting of LED bare chips Dnm. However, the substrate 10 may also be in single-layer structure that uses only one insulation layer, or in multi-layer structure that uses three or more insulation layers.

As shown by FIG. 3 and FIG. 4, on the front surface of the insulation layer 40 positioned at the front-side, a resin layer 50 is formed except for positions connecting the LED bare chips Dnm to the conductive lands 43. The resin layer 50 is provided to protect the conductive land 43, etc.

The metal base 20 is made of a metal material having excellent heat-dissipation characteristics (heat-conductive characteristics). One example of the metal material is an aluminum plate. The metal base 20 reinforces the insulation layer 30 and 40, and dissipates heat that the LED bare chips Dnm generate in light emission. Note that if a ceramic plate instead of the metal base 20 is used, the same heat-dissipating. effect as is generated by the metal base 20 is obtained.

The LED bare chips D65 and D66 are for example in a substantially rectangular solid form, and are made of InGaN. Each of the LED bare chips D65 and D66 is flip-chip mounted to the surface of the insulation layer 40 at the front side of the substrate 10 via a corresponding bump 55. The LED bare chip Dnm has a p-electrode and an n-electrode on the rear surface. The electrodes are not shown in the drawings. For example, the p-electrode of the LED bare chip D65 (or D66) is connected to the conductive land 43a via the bump 55a, and the n-electrode thereof is connected to the conductive land 43b via the bump 55b. Further details on how to mount the LED bare chip Dnm is given later.

As shown in FIG. 4, a resin inclusion body Rnm is made of resin (e.g. epoxy resin) that covers a corresponding LED bare chip Dnm. The resin inclusion body is for protecting the LED bare chip Dnm. The resin constituting the resin inclusion body Rnm contains phosphor.

The resin inclusion body Rnm is in a cylindrical columnar shape, for the purpose of restricting the portion that radiates the light emitted from the LED bare chip Dnm to outside the resin inclusion body Rnm, thereby bringing it closer to a point light source.

In the present embodiment, the resin inclusion body Rnm is made of epoxy resin, but is not limited to such. The resin inclusion body Rnm may be made of such resin as polyimide and silicon.

In the present embodiment, the-LED bare chip Dnm is made of InGaN (emitting blue light), and phosphor is mainly made of silica that emits light in broadband. According to these structures, blue light emitted from an LED bare chip Dnm is converted to white light by means of phosphor, and the white flight is emitted outside through a resin inclusion body Rnm.

The resin layer 50 is for example made of white epoxy resin, which is used in conventional cases. The reason why the resin layer 50 is white is for the purpose of efficiently extracting the light emitted from an LED bare chip Dnm to outside (front side).

As FIG. 3 and FIG. 4 show, the holes H65 and H66 are provided through the reflection plate 60, in position corresponding to the LED bare chips D65 and D66. In total, the number of the holes Hnm provided for the reflection plate 60 is 64. As FIG. 4 shows, the holes H65 and H66 are formed in a taper form that widens out towards the direction of the front surface side (i.e. towards the opposite side of the substrate 10, and in the upper side in FIG. 4)

The reflection plate 60 is for example a metal plate made of aluminum or the like. Alternatively, the reflection plate 60 may be made of white resin, or resin whose surface is furnished with plating. If the reflection plate 60 is made of aluminum, the reflection rate of the reflection plate 60 is improved and electrical insulation is assured, by performing anodizing to the circumferential surface of the reflection hole Hnm to form oxide coating.

As FIG. 2-FIG. 4 show, the lens plate 70 is provided with convex lenses Lnm, in position corresponding to the holes Hnm of the reflection plate 60 (i.e. corresponding to where the LED bare chips D65 and D66 are mounted). As shown in FIG. 4, resin constituting the lens plate 70 is filled in the hole Hnm of the reflection plate 60.

The lens plate 70 is made of such a material as a translucent resin (e.g. epoxy resin, acrylic resin, and silicon resin), and glass.

(C) Mounting LED Bare Chip

An LED bare chip Dnm is mounted to a wiring pattern 33 (i.e. conductive land 43) formed on the insulation layer 40 positioned in the front side, via a bump 55 made of gold or the like.

The wiring patterns 33, provided on the insulation layers 30 and 40, are formed to serially connect the LED bare chips Dnm in the following way. Suppose dividing the LED bare chips Dnm into two groups: the first group made up of LED bare chips Dnm from the first to fourth rows (n=1-4, m=1-8); and the second group made up of LED bare chips Dnm from the fifth to eighth rows (n=5-8, m=1-8). Then, the wiring patterns 33 are provided so as to serially connect among the LED bare chips Dnm within each of the first and second groups.

As shown in FIG. 2 and FIG. 3, the wiring pattern for the first group of LED bare chips Dnm is connected to connection terminals 42A and 42B formed on the surface of the substrate 10. The wiring pattern for the second group of LED bare chips Dnm is connected to connection terminals 42C and 24D formed on the surface of the substrate 10. Power is supplied to each group of LED bare chips Dnm, via the connection terminals 42A, 42B, 42C, and 42D.

Figure 5:
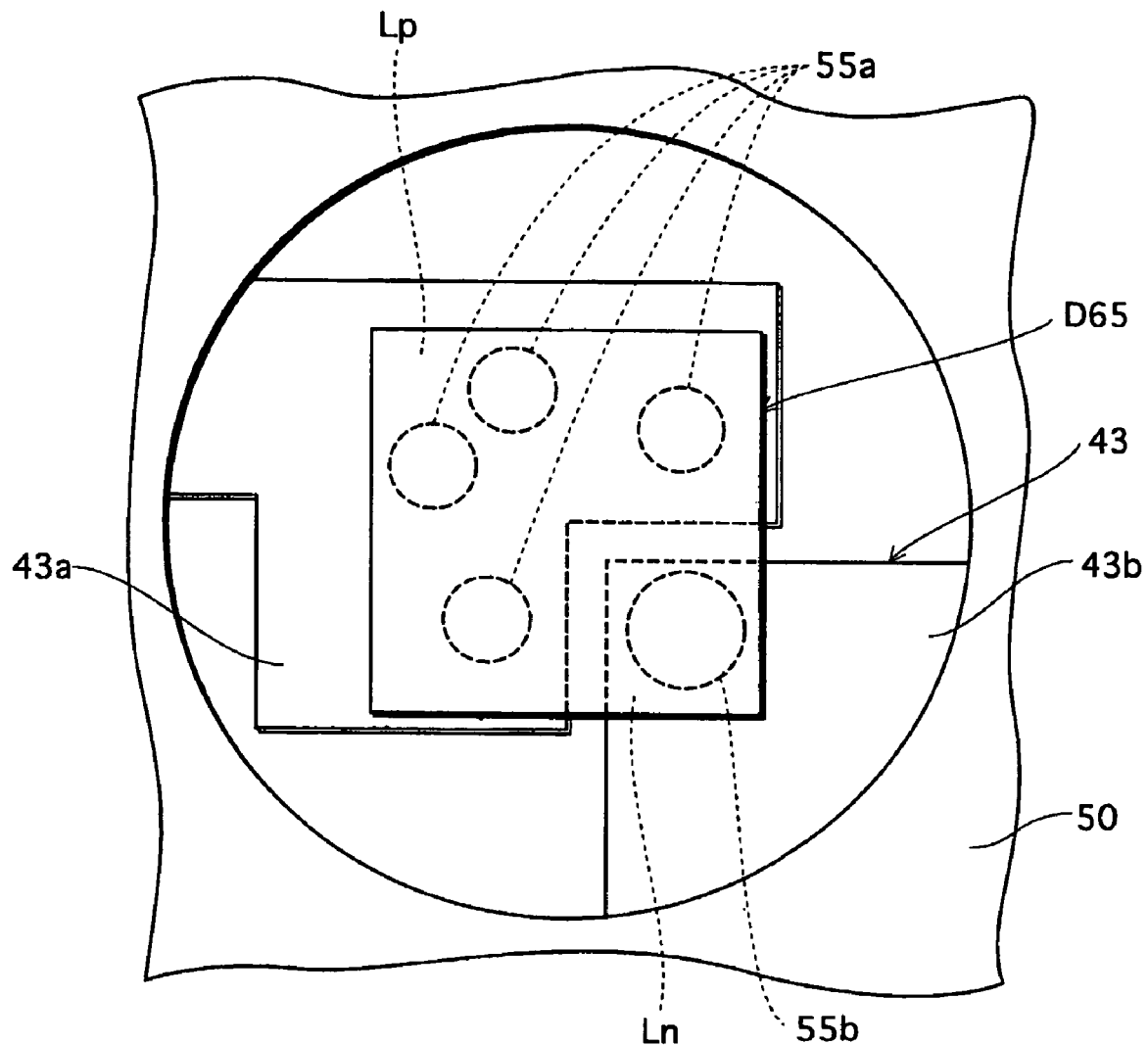
FIG. 5 shows a plan view of the LED bare chip D65 of FIG. 4 when it is already mounted.
Figure 6:
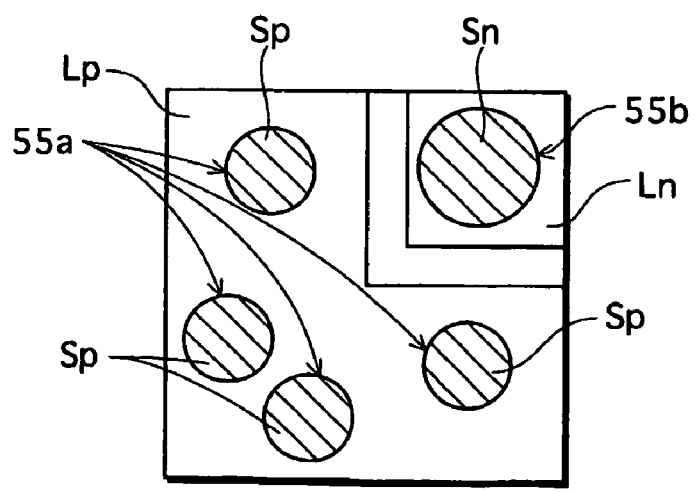
FIG. 6 is a diagram showing the LED bare chip D65 mounted to a substrate, which is cut at the bumps and seen from the direction of the substrate.

FIG. 5 shows a plan view of the LED bare chip D65 of FIG. 4 when it is already mounted. FIG. 6 is a diagram in which the LED bare chip D65 mounted to the substrate is cut at the bumps, when seen from the direction of the substrate.

As briefly explained above, the LED bare chip Dnm is a single-sided electrode type, which has both of a p-electrode Lp and an n-electrode Ln, on the rear surface. Here the p-electrode Lp is larger in area than the n-electrode Ln. Accordingly, as shown in FIG. 5 and FIG. 6, the p-electrode Lp is bonded to the conductive land 43a via four bumps 55a; and the n-electrode Ln is bonded to the conductive land 43b via one bump 55b.

As a result, each one of the bumps 55a will have one bonded portion with the electrode Lp, and the bump 55b will have one bonded portion with the electrode Ln. Each of the stated bonded portions with the electrode is occasionally referred to as "first portion" in the present invention. In addition, each one of the bumps 55a will have one bonded portion with the conductive land 43a, and the bump 55b will have one bonded portion with the conductive land 43b. Each of the stated bonded portions with the conductive land is occasionally referred to as "second portion" in the present invention. In the present embodiment, the smallest portion in area of all the first and second portions of all the bumps exists on the first portion side (on the electrode side). Therefore, the bonded area in the following explanation is assumed to be a bonded area between a bump and a corresponding electrode.

A bonded area Sn of the bump 55b is larger than a bonded area Sp of any one of the bumps 55a.

This means that the bump 55b used to bond the n-electrode Ln is larger in volume than any one of the umps 55a used to bond the p-electrode Lp.

At the side of the p-electrode Lp, the bonded areas Sp of the bumps 55a are all the same, in terms of designing. In other words, if there are variations among the bonded areas Sp of the bumps 55a incident to manufacturing processes, the bonded areas Sp are still considered the same.

2. Mounting of LED Bare Chip

The manufacturing method of an LED light source consists of: a substrate manufacturing process for manufacturing a substrate on which conductive lands for LED bare chips are formed; a bump forming process for forming bumps on the conductive lands of the substrate; a mounting process for mounting the LED bare chips to the substrate via the formed bumps; a reflection plate attaching process of attaching a reflection plate to the substrate; and a lens plate forming process of forming a lens plate to the substrate to which the reflection plate has been attached.

Among them, the substrate manufacturing process, the reflection plate attaching process, and the lens plate forming process are the same as those performed conventionally. Therefore, the following only details the bump forming process and the mounting process.

(1) Bump Forming Process

The bump 55 is a stud bump. The following describes a process by which the stud bump is formed.

Figure 7:
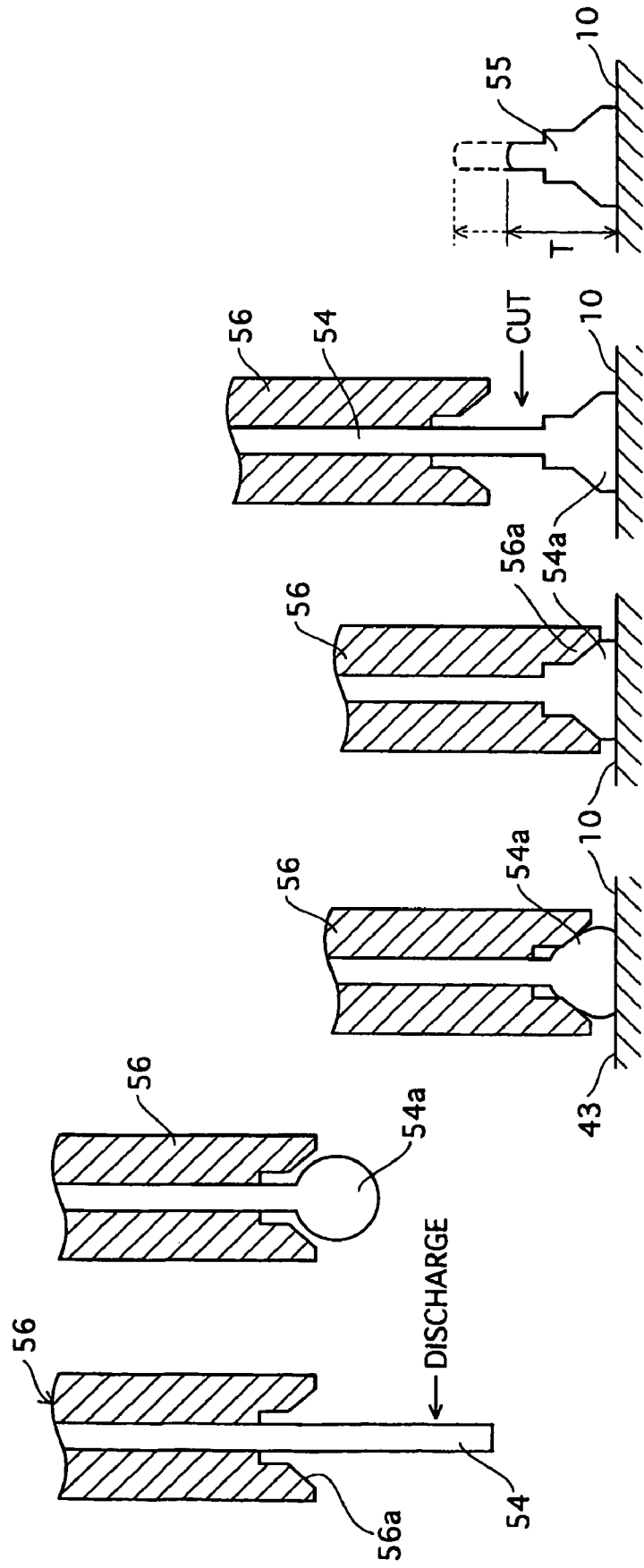
FIG. 7 shows an overview of the stud bump manufacturing process.

FIG. 7 shows an overview of the stud bump manufacturing process.

The bump 55 is formed using a mold used for wire bonding, and the like. This mold pays out wire from the tip, applies high-voltage power to the paid out wire, and cuts the wire.

First, from a tip 56a of a mold 56, a gold wire 54 made of a same material as the bump 55 is paid out for a predetermined length, as shown as (a). The length of the gold wire 54 to be paid out is determined by the desirable size (volume) of the bump 55.

After the gold wire 54 is paid out, high voltage is applied to the gold wire 54, to generate discharge. As a result of this discharge, the paid out portion of the gold wire 54 will have a spherical form as shown in (b). Hereinafter, thus resulting object that is to be the bump 55 is referred to as a premonitory body 54a.

Once the premonitory body 54a is formed, the mold 56 is lowered as shown in (c), so as to press the premonitory body 54a to the conductive land 43 formed on the substrate 10. Under this condition, the mold 56 is further lowered in ultrasonic vibration.

By doing so, the premonitory body 54a is softened, and is deformed to conform to the form of the inner wall of the tip 56a of the mold 56. As a result, the premonitory body 54a is bonded to the substrate 10. The bonded area of the premonitory body 54a that is bonded to the substrate is the same, regardless of the bump 55a and the bump 55b.

Next, the gold wire 54 is released from the mold 56. As shown in (e), the gold wire 54 is cut at a predetermined position, after raising the mold 56. As a result, the bump 55 as (f) will be formed. Note that the position of the gold wire 54 to be cut is determined by a position in which the mold 56 is raised. Accordingly, as (f) shows, bumps 55 having different heights T can be easily created (see both the solid and broken lines).

(2) Mounting LED Bare Chip

Figure 8:
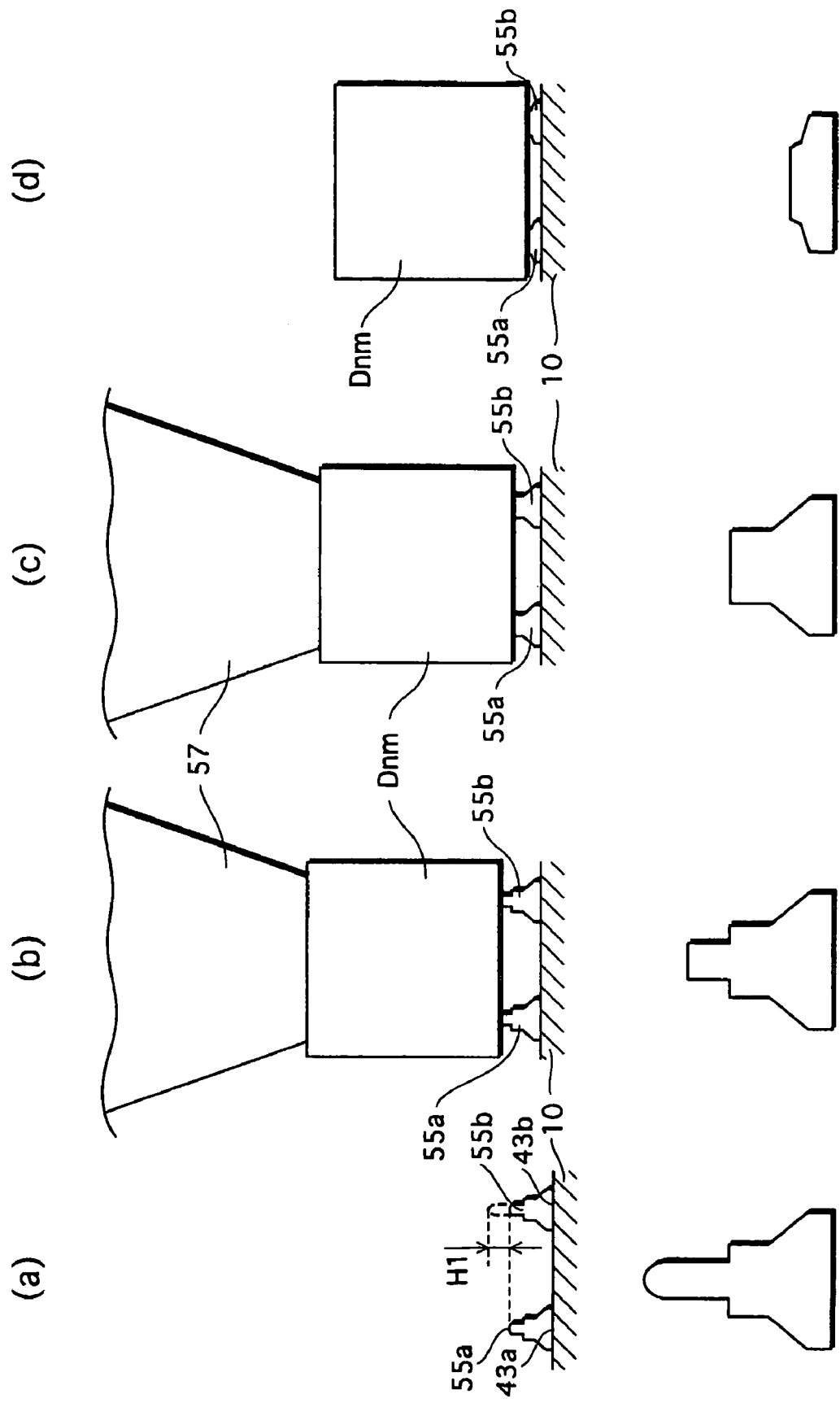
FIG. 8 is a diagram for explaining the process for mounting an LED bare chip.
Figure 9:
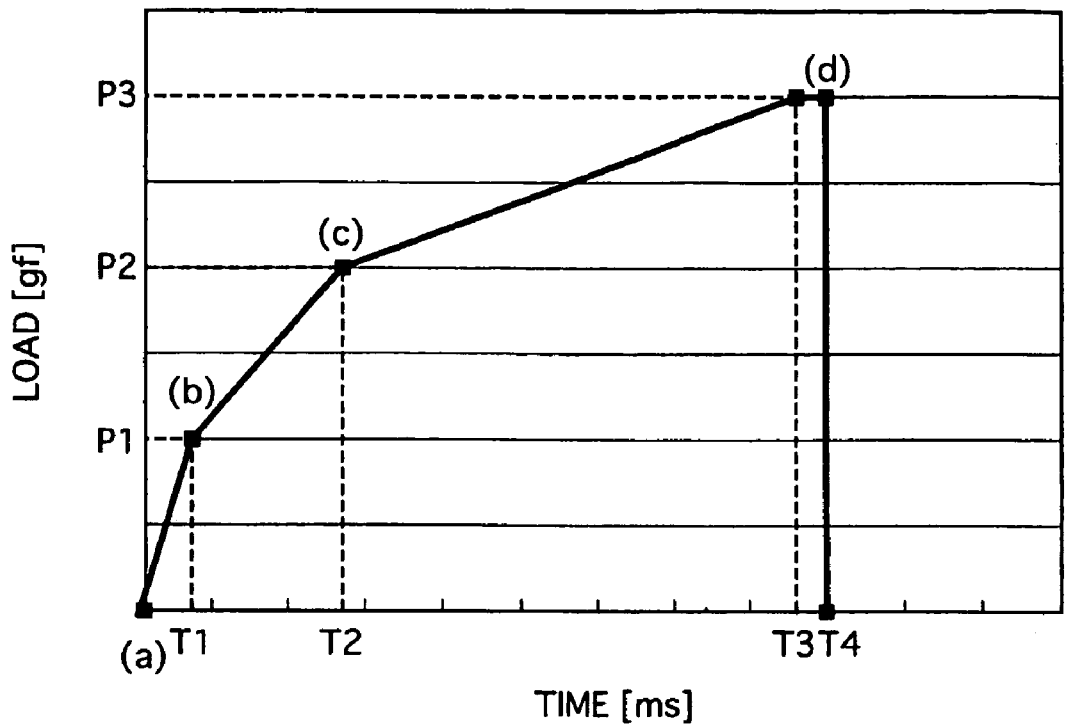
FIG. 9 is a diagram showing a load condition in the process of mounting an LED bare chip.
Figure 10:
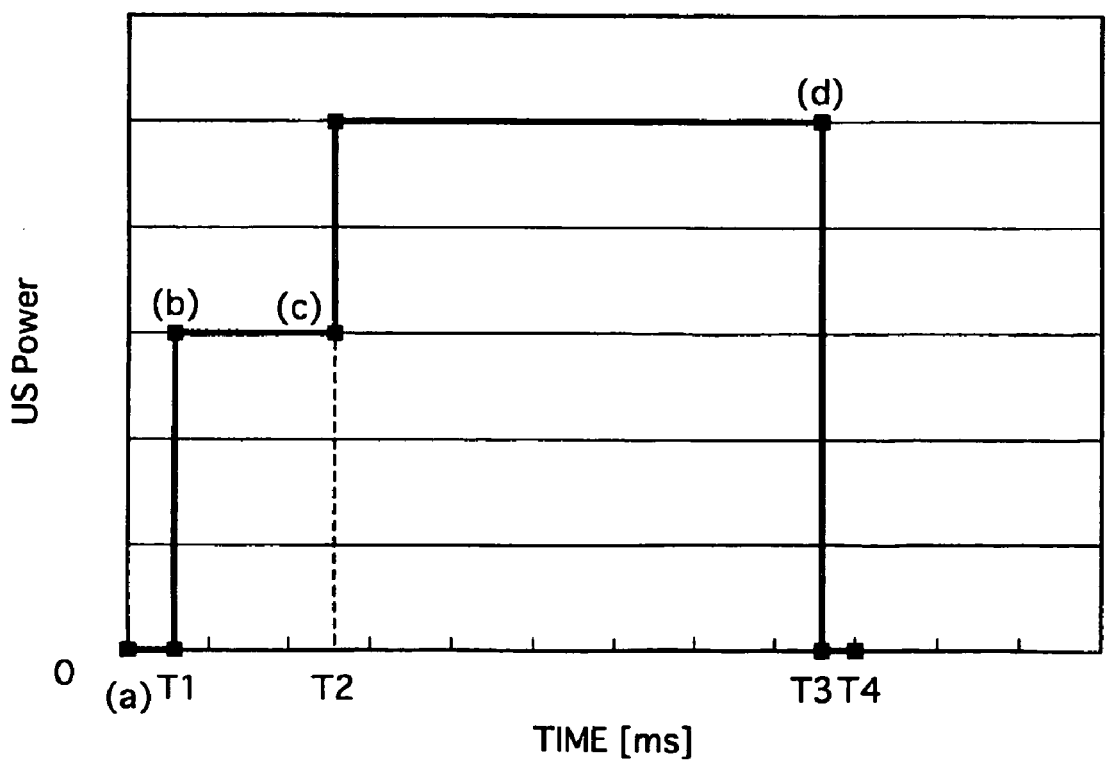
FIG. 10 is a diagram showing an ultrasound application condition in the process of mounting an LED bare chip.

FIG. 8 is a diagram for explaining the process for mounting an LED bare chip. FIG. 9 and FIG. 10 are diagrams showing mounting conditions of an LED bare chip.

First, each step in the process of mounting an LED bare chip is briefly explained.

A publicly-known flip chip bonder (not illustrated) is used to mount the LED bare chip Dnm. This flips chip bonder is an apparatus performing in the following way, for example, for bonding the LED bare chip Dnm to the substrate 10. By moving a stage on which the substrate 10 is placed, a position in the substrate 10 at which the LED bare chip Dnm is designed to be mounted is adjusted to a position at which a collet, conveying the LED chip 14 from somewhere by absorption, is stationed. In this state, the collet is lowered to press the LED bare chip Dnm absorbed at the tip, against the substrate 10 via the bump 55. Then, ultrasonic vibration is given to the LED bare chip Dnm for a predetermined time.

Here, a plurality of bumps 55a and 55b (5 bumps total in this example) are employed for one LED bare chip Dnm, so as to improve the positional accuracy in mounting the LED bare chip Dnm. Specifically, when two bumps are used, an LED bare chip Dnm will be supported by corresponding two points, after being conveyed to the designed position by a collet and when placed on the bumps 55a and 55b. In this case, if ultrasound is applied to the LED bare chip Dnm in a tilted condition, the actual position in which the LED bare chip Dnm is mounted can be deviated from an intended position. However, when three or more bumps are used, the LED bare chip Dnm will be supported by corresponding three or more points, which enhances stability in the mounting process.

The mounting process of LED bare chips consists of: a l leveling step of placing an LED bare chip Dnm on a bump 55 formed on the substrate 10 and of keeping the height of the bump 55 aligned ((b) in FIG. 8); and a pressing step including provisional pressing ((c) in FIG. 8) and full-scale pressing ((d) in FIG. 8) the LED bare chip Dnm resulting from the leveling step, under load and ultrasound whose conditions are respectively shown in FIG. 9 and FIG. 10.

Each step is explained below in the stated order.

(a) Leveling Step

The heights of the bumps 55a and 55b generated in the bump forming step are not even. Specifically, the bump 55b has more height than that of the bump 55a (represented by H1 in the drawing), where the bump 55b is to be bonded to the n-electrode Ln, and the bump 55a is to be bonded to the-p-electrode Lp. In the leveling step, the heights of the bumps 55a and 55b are made to be even to a certain level.

In the leveling step, the following is specifically performed. A tip of a collet is used to absorb the LED bare chip Dnm. The electrodes Lp and Ln of the LED bare chip Dnm are adjusted to position above the bumps 55a and 55b, respectively. Then the LED bare chip Dnm (i.e. the collet 57) is lowered to press the lower surface of the LED bare chip Dnm to the bumps 55a and 55b.

In this leveling step, the load is increased-as time elapses, so that the load is P1 at the time T1, as FIG. 9 shows. On the other hand, ultrasound is not applied as shown in FIG. 10. The vertical axis in FIG. 10 represents power (i.e. amplitude) of ultrasound vibration.

The bump 55b for connecting to the n-electrode has more height than that of the bump 55a for connecting to the p-electrode. Therefore in the leveling step, the bump 55b comes into contact with the lower surface of the LED bare chip Dnm earlier than the bump 55a. In addition, it is the bump 55b that is first deformed along the surface of the n-electrode of the LED bare chip Dnm. The bump 55a, too, will eventually come into contact with the surface of the p-electrode of the LED bare chip Dnm to be deformed, as the lowering of the LED bare chip Dnm.

(b) Provisional Pressing

After the leveling step, the LED bare chip Dnm is further pressed towards the substrate 10, while being applied with ultrasound. Here, as shown in FIG. 9, the load is controlled to increase as time elapses, so that the load becomes P2 at time T2. Meanwhile, ultrasonic vibration is applied at a constant power, as shown in FIG. 10.

In this provisional pressing step, the LED bare chip Dnm further presses down the bumps 55a and 55b. Therefore, the portion of the bumps that used to position inside during the bump forming step will emerge outside to be in contact with the electrodes of the LED bare chip Dnm. This inner portion is occasionally referred to as "newly-emerged portion". This structure enhances the bonding force between the bump 55 and the LED bare chip, as well as the bonding force between the bump 55 and the conductive land 43. This phenomenon is detailed later.

(c) Full-Scale Pressing

After the provisional pressing, the LED bare chip Dnm, with more power and in ultrasonic vibration, is pressed towards the substrate 10. Here, the load is controlled to increase as time elapses, so that the load becomes P3 at time T3. Meanwhile, ultrasonic vibration is applied at a constant power, as shown in FIG. 10.

After performing the leveling step through the full-scale pressing step, the LED bare chip Dnm will be mounted to the conductive land 43 formed on the substrate 10. Before these steps, the bump 55b for connecting to the n-electrode has more height than that of the bump 55a for connecting to the p-electrode. Therefore, the bump 55b will reach the rear surface of the LED bare chip Dnm before the bump 55a does. Then as the LED bare chip Dnm is lowered, the bump 55b is deformed along the rear surface of the LED bare chip Dnm. According to this operation, the bonded area (Sn) between the bump 55b and the n-electrode Ln is larger than the bonded area (Sp) between any one of the bumps 55a and the p-electrode Lp. Therefore, even when only one bump is used for connecting to the n-electrode, the bonding (conductivity) between the n-electrode and the bump is ensured.

So far, the present invention has been described by way of the embodiment. However, needless to say, the present invention should not be limited to the concrete examples stated above. For example, the following modification examples are possible.

1. Form of Bump

In the above-stated embodiment; before mounting the LED bare chip Dnm, the bump 55b for connecting to the n-electrode has more height than that of the bump 55a for connecting to the p-electrode. However, the present invention is able to improve reliability of bonding between the n-electrode Ln and the bump 55b, as long as the bonded area Sn between the n-electrode Ln and the bump 55b is larger than the bonded area Sp between the p-electrode Lp and the bump 55a.

Therefore, the bumps may be in any form as long as the bonded area Sn between the n-electrode Ln and the bump 55b is larger than the bonded area Sp between the p-electrode Lp and the bump 55a.

The following describes a modification example 1, in which the bumps are different, in form, from the bumps 55a and 55b.

Figure 11:
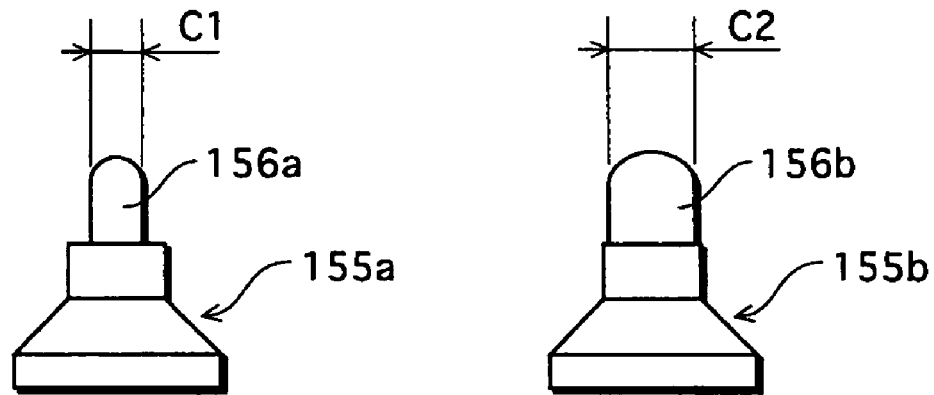
FIG. 11 is a diagram showing the bumps according to a modification example 1.

FIG. 11 is a diagram showing bumps according to the modification example 1. The difference between the bumps shown in the embodiment and the bumps in the modification example 1 is the diameter (i.e. thickness) of a part of a bump to be deformed in mounting of the LED bare chip. More specifically, a diameter C2 of a top side 156b of a bump 155b is larger than a diameter C1 of a top side 156a of a bump 155a, where the bump 155b is to be connected to an n-electrode and the bump 155a is to be connected to a p-electrode and the n-electrode is smaller in area than the p-electrode. In other words, the top side 156b of the bump 155b is thicker than the top side 156a of the bump 155a.

In this case too, an n-electrode will have a larger bonded area with respect to a corresponding bump, than a p-electrode. Therefore, even when the n-electrode having a small area is bonded to a conductive land using only one bump, it is still possible to improve the reliability of bonding between the n-electrode. and the conductive land.

Next, the form of the bumps according to the modification example 1 is described.

The diameter C1 of the top side 156a of the bump 155a is different from the diameter C2 of the top part 156b of the bump 155b. However, the bumps of the present invention should not be limited to a particular form defined by the thickness of the top side, the height of the bumps, and the like. The effect of the present invention is still obtainable even if the thickness of the top side and the height of the bump are not as stated above. In the present description, "thickness" is a size in a direction orthogonal to the direction in which the bump is pressed in mounting of the LED bare chip. "height" is a size in the direction in which the bump is pressed in mounting of the LED bare chip.

Figure 12:
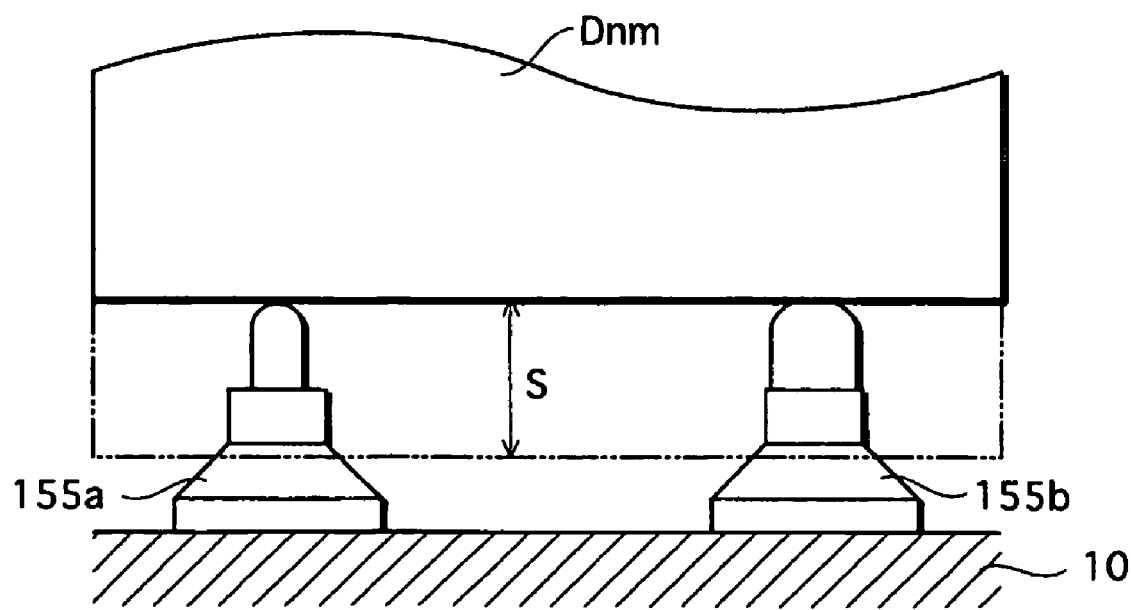
FIG. 12 is a diagram showing a state of the bumps before they are deformed.

FIG. 12 is a diagram showing a state of the bumps before they are deformed.

The rear surface of the LED bare chip Dnm is in contact with the bump being largest in height of all the plurality of bumps (in the drawing, only the bumps 155a and 155b are shown). Here, the bump 155a and the bump 155b have the same height, and so come into contact with the lower surface of the LED bare chip Dnm substantially at the same time.

The solid line in FIG. 12 shows this state. The LED bare chip Dnm is further lowered, thereby deforming the bumps 155a and 155b. The volumes of the bumps 155a and 155b are to be deformed as a result of lowering of the LED bare chip Dnm are volumes of the parts of the bumps 155a and 155b that correspond to the lowered part of the LED bare chip (shown by "S" in the drawing).

Accordingly, by lowering the LED bare chip Dnm, the bonded area between the rear surface of the LED bare chip Dnm and the bumps 155a and 155b will become larger as the volumes of the bumps 155a and 155b, corresponding to the lowered part of the LED bare chip Dnm, become large. Accordingly, the bonded area between the bumps 155a, 155b, and the LED bare chip Dnm will be large too.

As stated above, the bumps may be in any form as long as the volumes, corresponding to the lowered part of the LED bare chip, are varied from each other. Increasing the length of the top side, or increasing the diameter of the top side are means to have variations of the stated volumes.

It is also possible to form the bumps in columnar shape whose transverse cross sections differ from each other. For creating such columnar bumps, two or more kinds of molds whose tips' inner walls are different in areas from each other may be used.

Next, the sizes of the bumps are described.

The size of each bump is determined by the volume to be deformed (which corresponds to the part of the LED bare chip to be lowered), and not by the height or the thickness of the bump. As the volume to be deformed becomes large, the bonded area also becomes large. This means that if the size difference between bumps (i.e. volume difference in deformed parts between bumps) is larger than the size variations generated at the bump production, bonding between the smaller-area electrode in the LED bare chip and a corresponding conductive land becomes more reliable.

More specifically, if the smallest size generated in producing the bump for connecting the smaller-area electrode is larger than the largest size generated in producing the bump for connecting the larger-area electrode, it is assured that both of the smaller-area electrode and the corresponding conductive land will be in contact with the bump therebetween.

The inventors of the present invention produced the bumps explained in the embodiment, and measured the dimensions of the bumps as follows. An average height is 76 μm, a maximum height is 84 μm, and a minimum height is 71 μm. This means that the height variation is about 8.4%. In other words, the height will be in the range of 8.4% difference from the average.

Considering the above, bonding between bumps and an LED bare chip, or between bumps and conductive lands is assured if the volume of a part of the larger-size bump, which corresponds to the volume of a lowered part of the LED bare chip, is larger by at least 16.8%, than the volume of a part of the smaller-size bump, which corresponds to the volume of the lowered part of the LED-bare chip. Note that the stated value 16.8% is twice the height variation (8.4%). Here, the bonded area for the larger-size bump is about 1.17 times the bonded area for the smaller-size bump.

Here, it is also possible to give more weight to the variation incident to production, for the purpose of increasing the reliability of bonding between the bumps and the LED bare chip. For example, in the above-described example, the height variation may be set as 10% (i.e. 1.2 times 8.4%), in determining the size of bumps. By doing so, the bonded area for the larger-size bump will be about 1.2 times the bonded area for the smaller-size bump.

The LED bare chip used in the explanation is in a quadrangular columnar shape, whose bottom surface is a quadrangle of 320 μm*320 μm. The height of the LED bare chip is 100 μm. The area of the p-electrode is 78400 μm². The area of the n-electrode is 24000 μm².

The maximum size of the bump for connecting to the n-electrode is in such a range that the deformed bump is not in contact with the p-electrode or with the conductive land for the p-electrode, because it would cause a short.

2. Mounting Process of LED Bare Chip

In the embodiment, the load exercised onto the LED bare chip Dnm in the process of mounting the LED bare chip Dnm to the substrate 10 is continuously varied over time. This condition of load is referred to as "variable load condition". However, the present invention is not limited to such. For example, the load exercised on to the LED bare chip in the process of mounting the LED bare chip may be fixed during a predetermined time period (hereinafter "fixed load condition"). This is detailed as follows as a modification example 2.

Figure 13:
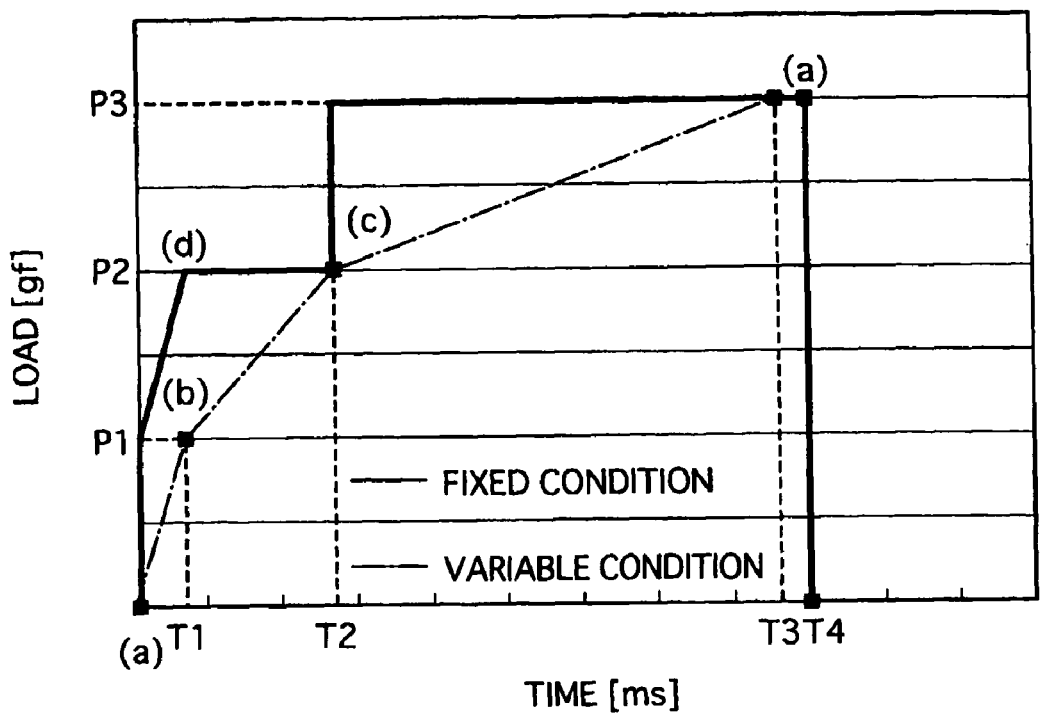
FIG. 13 is a diagram showing a load condition employed in a modification example 2.

FIG. 13 is a diagram showing a load condition employed in the modification example 2.

Note that both of the load conditions (variable and fixed) are described in this drawing, so as to clarify the difference between these conditions. The load condition employed in the embodiment is labeled as "variable condition", whereas the load condition employed in the modification example 2 is labeled as "fixed condition".

In the fixed condition, the load P1 is first exercised so as to have the LED bare chip to abut against the bump, and then the load is gradually raised so that the load of P2 is obtained at the time T1, while performing leveling (shown as (b) of FIG. 13).

Next, at the time T1, the LED bare chip starts receiving ultrasound (FIG. 10), and the fixed load of P2 is continued to the time T2 for provisional pressing ((c) of FIG. 13). At the time T2, ultrasound is strengthened (FIG. 10), and the load is increased to P3, which is maintained up to the time T4, for full-scale pressing(shown as (d) in FIG. 13).

The load may be in a fixed condition as stated above. However, the variable load condition explained in the embodiment is preferable, because when an LED bare chip is bonded with bumps in the variable load condition, it generates a higher bonding force with the bumps or with the conductive lands, than in a case of the fixed load condition.

Figure 14:
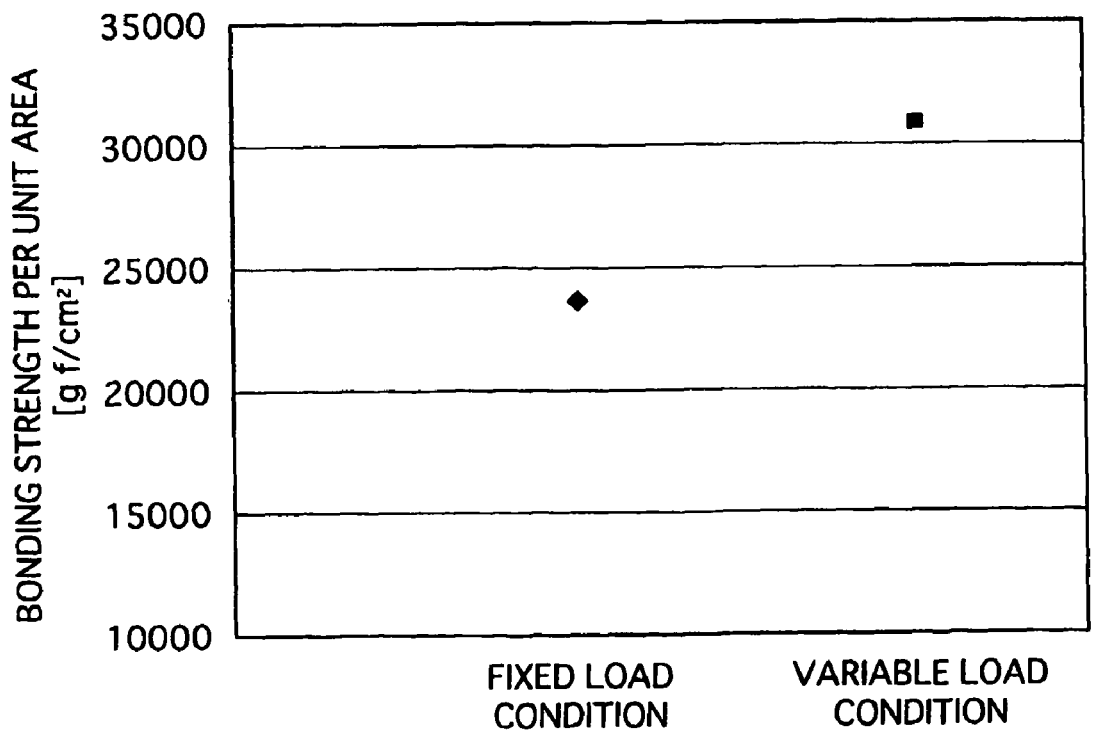
FIG. 14 is a diagram showing the difference of bonding force between an LED bare chip and bumps, for each load condition.

For LED bare chips and corresponding conductive lands bonded in different load conditions from each other, the bonding force in response to the shearing force is examined. FIG. 14 shows the difference of bonding strength between the load conditions.

As this drawing shows, the bonding strength under the variable load condition is 30.8 kgf/mm², and the bonding strength under the fixed load condition is 23.8 kgf/mm², which exhibits about 1.3 times improvement. Note that this test is conducted by applying load to the LED bare chip mounted on a substrate, in a parallel direction to the main surface of the substrate.

Here, if the bonding strength (bonding force per unit area) between the LED bare chip and the substrate is enhanced, the bonded area can be smaller by the amount of improvement in the bonding strength. In other words, the bump may be formed smaller. Accordingly, short is prevented which would occur when part of the deformed bumps comes into contact with the side surface of an LED bare chip when mounting the LED bare chip.

3. Bonded Area of Bumps

In the embodiment, a bonded area between the bump 55 and the LED bare chip Dnm is explained as a bonded area between the LED bare chip Dnm and the conductive land 43. The reason for this is as follows. The bumps used in the embodiment are different from each other in height. Here, suppose a case where these bumps are provided for the substrate in advance, and an LED bare chip is to be bonded to these bumps. Then, bonded areas respectively of the bumps with corresponding conductive lands will be the same from a designing point of view. Of course, there will be variations in manufacturing. In the above case, a bonded area is larger for a bonded portion between a bump and a conductive land than a bonded portion between the bump and an LED bare chip. In the present invention, it is necessary to find the smallest bonded area of all the bumps used in bonding the LED bare chip and the substrate. In view of this purpose of the present invention, it is a practical solution to use a bonded area between the bump 55 and the LED bare chip Dnm as a bonded area between the LED bare chip Dnm and the conductive land 43.

On the contrary, suppose a case where the bumps of the embodiment are provided for the LED bare chip in advance. In this case, the smallest bonded portion will exist on the conductive lands' side. Therefore, for the purpose of the present invention, it is practical to use a bonded area between the bump 55 and the conductive land, as a bonded area between the LED bare chip Dnm and the conductive land 43.

Furthermore, in some cases, it is likely to be uncertain on which side of an LED bare chip and a conductive land the smallest bonded portion exists. This may occur depending on specification of bumps (e.g form or size) and on mounting method of an LED bare chip to a substrate. In such cases, it is practical to use the bonded area of one of the two bonded portions of al the bumps used in bonding (either with an electrode or with a conductive land), the one of the bonded portions including the smallest portion in area of all the bonded portions.

It is also preferable to adopt a variable load condition when forming a bump on an LED bare chip so as to maintain strength, from the same reason stated above.

4. Light Emitting Device

In the embodiment, an LED bare chip, having a quadrangular bottom surface (320 μm*320 μm) is used as a light emitting device. However, the light emitting device according to the present invention may also take other forms and sizes. For example, the bottom surface may be in a form of a rectangle, a polygon, or an oval. The following describes a modification example 3, in which an LED bare chip is different in size from the LED bare chip of the embodiment.

If the LED bare chip in the modification example 3 is used, the same effect as obtained in the embodiment is obtainable. In addition, the LED bare chip in the modification example 3 is also mountable to the conductive lands in the same method as explained in the embodiment.

Figure 15A:
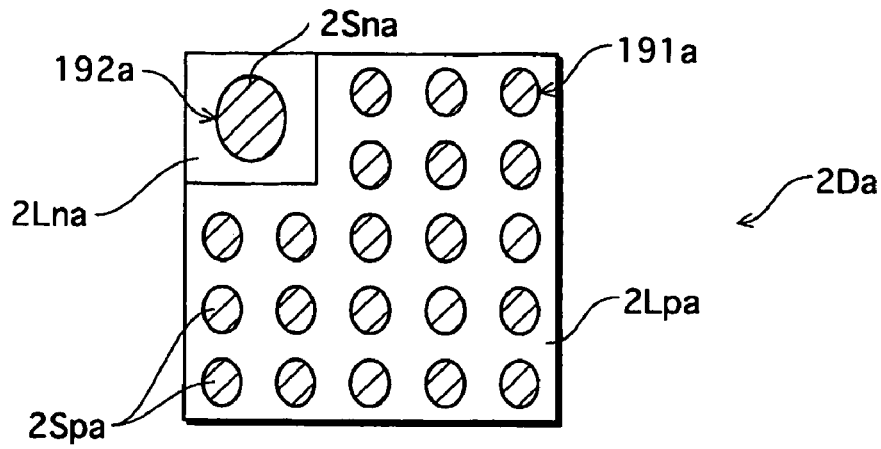
FIGS. 15A, 15B, and 15C are diagrams showing the LED bare chip 2D according to a modification example 3, which is cut at the bumps and seen from the direction of the substrate.
Figure 15B:
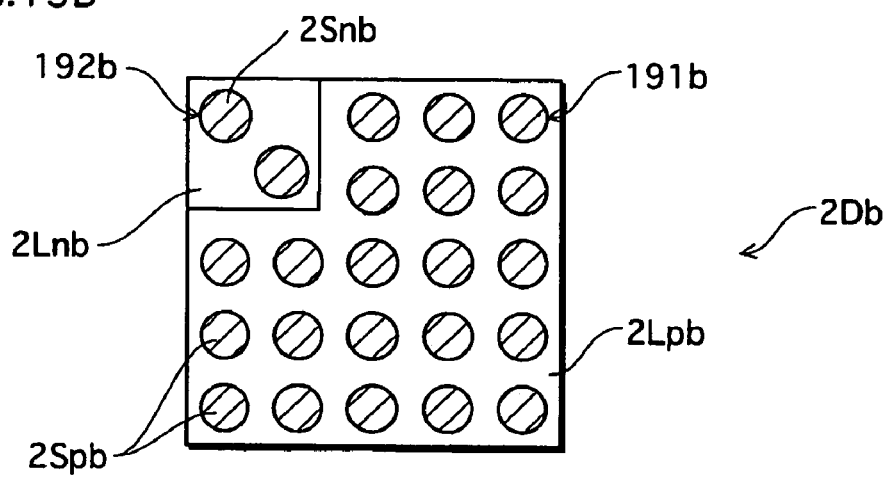
Figure 15C:
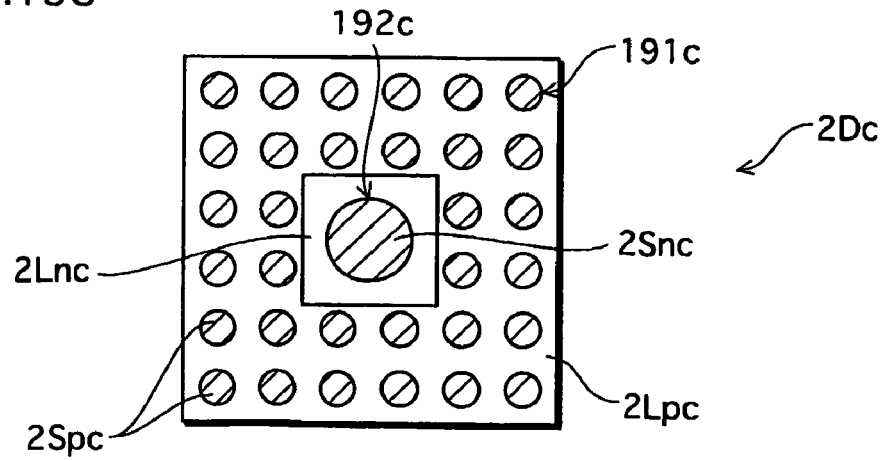

FIGS. 15A, 15B, and 15C are diagrams showing the LED bare chip according to the modification example 3, which is cut at the bumps and seen from the direction of the substrate.

(A) EXAMPLE 1

FIG. 15A shows an LED bare chip 2Da according to the example 1 of the modification example 3. An LED bare chip 2Da has a square bottom surface of 1 mm*1 mm. As explained in the embodiment, an n-electrode 2Lna is positioned at one corner of the bottom surface, and the n-electrode 2Lna is smaller in area than a p-electrode 2Lpa.

Bumps 191a and 192a for bonding the LED bare chip 2Da and a substrate (conductive lands) are-different in cross sectional area. In addition, the number of bumps is different for each electrode. More specifically, one bump 192a exists for the n-electrode 2Lna, and 21 bumps 191a exist for the p-electrode 2Lpa. With regard to a cross sectional area for each bump, the cross sectional area 2Sna of the bump 192a at the n-electrode 2Lna side is larger than the cross sectional area 2Spa of one bump 191a at the p-electrode 2Lpa side. This also means that the bump 192a is larger than one bump 191a.

As can be understood by FIG. 15A, the cross sections of the bumps 191a and of the bump 192a are substantially oval, respectively. The sizes of the bump 192a are: a major axis of 150 μm, and a minor axis of 100 μm. The sizes of each bump 191a are: a major axis of 100 μm, and a minor axis of 65 μm.

There are 21 bumps 191a at the side of the p-electrode 2Lpa, and are arranged in an orderly formation. By arranging the bumps (191a) used at the larger-area electrode, in an orderly formation, uniform electric current density within the larger-area electrode (p-electrode 2Lpa) is obtained. Uniform electric current density is considered to lessen brightness variations, by enabling the light emitting surface to maintain uniform heat dissipation characteristics.

In particular, the present LED bare chip is larger than the LED bare chip in the first embodiment, with one side of the bottom surface having a length of 1 mm (in comparison, one side of the bottom surface of the LED bare chip has a length of 0.3 μm). Accordingly, the distance between adjacent bumps 191a tends to be large. When the distance between adjacent bumps 191a becomes large in this way, uniform electric current density tends to be impaired, due to positions of the bumps 191a in the p-electrode 2Lpa. Accordingly, the brightness variations tend be more obvious. Therefore, for an LED bare chip having a large light emitting area, it is considered effective to arrange bumps at the side of the p-electrode in an orderly formation, for the purpose of maintaining uniform heat dissipation characteristics of the surface, as counter measures against the brightness variation problem.

(B) EXAMPLE 2

FIG. 15B shows an LED bare chip 2Db according to the example 2 in the modification example 3. As FIG. 15B shows, the structures of the LED bare chip 2Db are substantially the same as in the example 1, such as in form and size of the bottom surface, and a ratio between the area of the n-electrode and the area of the p-electrode. However, in the example 2, two bumps 192b exist for the n-electrode 2Lnb, and 26 bumps 191b exist for the p-electrode 2Lpb. The bumps 191b are arranged in an orderly formation. The cross sections of the bumps 191b and of the bumps 191a are substantially round, respectively. With regard to a cross sectional area for each bump, the cross sectional area 2Snb of one bump 192b is larger than the cross sectional area 2Spb of one bump 191b.

(C) EXAMPLE 3

FIG. 15C shows an LED bare chip 2Dc according to the example 3 of the modification example 3. As FIG. 15C shows, the structures of the LED bare chip 2Dc are substantially the same as in the example 1, such as in form and size of the bottom surface, and a ratio between the area of the n-electrode and the area of the p-electrode. However, the example 3 is different from the examples 1 and 2, in that an n-electrode 2Lnc exists like an island in the substantial center of the bottom surface of the LED bare chip 2Dc. In the example 3, one bump 192c exists for the n-electrode 2Lnc, and 32 bumps 191c exists for the p-electrode 2Lpc. The bumps 191c are arranged in an orderly formation. With regard to the cross sectional area of each bump, the cross sectional area 2Snc of the bump 192c is larger than the cross sectional area 2Spc of one bump 191c.

5. Substrate

In the embodiment, the substrate 10 is for mounting thereon a plurality of LED bare chips Dnm, however may alternatively be for mounting one LED bare chip. An example of such a substrate is a so-called "sub-substrate". As follows, the sub-substrate is described as a modification example 4.

Figure 16:
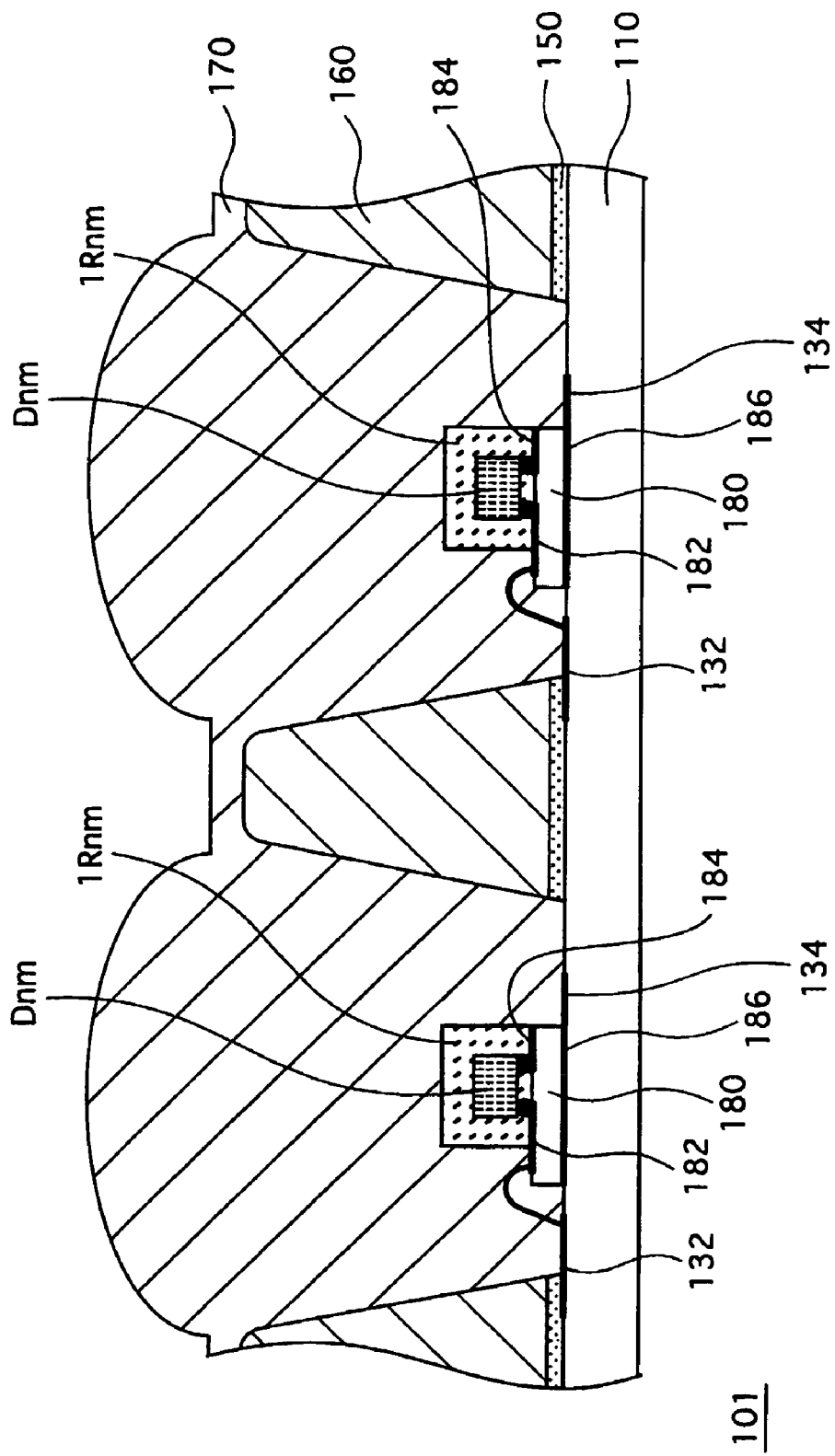
FIG. 16 is an enlarged cross sectional view of an LED light source according to a modification example 4.

FIG. 16 is an enlarged cross sectional view of an LED light source according to the modification example 4.

An LED bare chip Dnm used for an LED light source 101 is mounted to a sub-substrate 180. This sub-substrate 180 is a silicon substrate for example. On a front surface of the sub-substrate 180, two conductive lands are provided: a conductive land 182 for connecting to one of the electrodes of the LED bare chip Dnm; and a conductive land 184 for connecting to the other electrode of the LED bare chip Dnm. The conductive land 184 on the front surface is connected to a conductive land 186 provided on the rear surface of the sub-substrate 180, by means of a via hole (not illustrated in the drawing), for example. Note that in FIG. 16, the conductive land 186 on the rear surface is integrated with a conductive land 134 provided on a main-substrate 110 into one land. The details are given later.

The LED bare chip Dnm is connected to the conductive lands 182 and 184, by means of bumps. In the stated state, the LED bare chip Dnm is covered with a phosphor resin member 1Rnm, as in the embodiment. Hereinafter, a component in which an LED bare chip Dnm is mounted to a sub-substrate 180 and is covered with a phosphor resin member 1Rnm is referred to as "sub-mount".

The present invention is also applicable to such a sub-mount, in mounting an LED bare chip Dnm to the sub-substrate 180.

In the LED light source 101, a reflection plate 160 and a lens plate 170 are provided, after the sub-mount is connected to conductive lands 132 and 134 formed on a main surface of the main-substrate 110 in a publicly-known method.

In addition, the sub-mount is not limited to the structure stated above. For example, the sub-substrate 180 is not limited to a silicon substrate, and may alternatively be a composite substrate, a glass epoxy substrate, a metal substrate, and a ceramic substrate.

6. Shape of Electrode

In the embodiment, the p-electrode is in L-shape, and the n-electrode is in a rectangular shape (including a square shape). However, the shape of each electrode is not limited to as described above. For example, the p-electrode may be in a U-shape, and the n-electrode may be in a polygon shape (e.g. hexagon shape).

The area of the p-electrode is preferably three times the area of the n-electrode. This is for improving the light extraction efficiency from the LED bare chips. If it is not particularly necessary to improve the light extraction efficiency, it is accordingly not necessary to define the relation between the area of the p-electrode and the area of the n-electrode.

7. N-Electrode

In the embodiment and the modification examples, the n-electrode on the rear surface of the LED bare chip is constituted by only one electrode part. However, in the light emitting device (LED bare chip) of the present invention, an electrode being smaller in area may be constituted by two or more electrode parts. The following describes a modification example 5, in which the number of electrode parts constituting the n-electrode of a LED bare chip is more than one.

If the LED bare chip in the modification example 5 is used, the same effect as obtained in the embodiment is obtainable. In addition, the LED bare chip in the modification example 5 is also mountable to the substrate in the same method as explained in the embodiment.

FIGS. 17A, 17B, 17C, and 17D are diagrams showing the LED bare chip according to the modification example 5, which is cut at the bumps and seen from the direction of the substrate.

(A) EXAMPLE 1

Figure 17A:
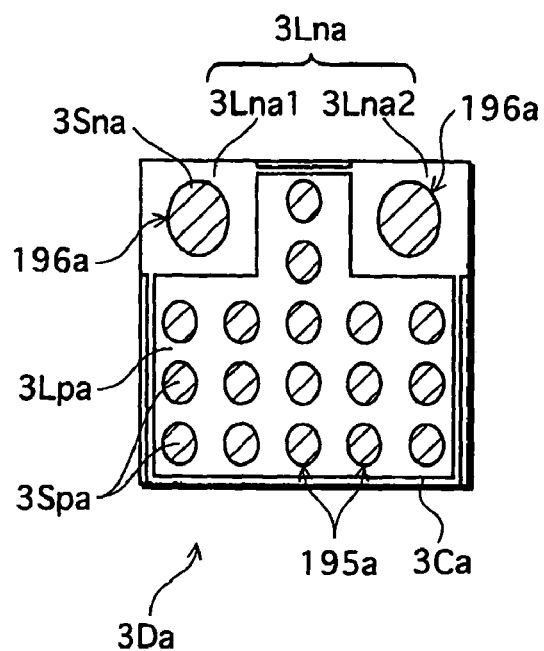
FIGS. 17A, 17B, 17C, and 17D are diagrams showing the LED bare chip according to a modification example 5, which is cut at the bumps and seen from the direction of the substrate.

FIG. 17A shows an LED bare chip 3Da according to the example 1 of the modification example 5. The LED bare chip 3Da has a square bottom surface of 1 mm*1 mm. Unlike the embodiment, an n-electrode 3Lna has a first electrode part 3Lna1 and a second electrode part 3Lna2, which are respectively and independently provided at two adjacent corners of the bottom surface of the LED bare chip 3Da. Two bumps 196a are used for the n-electrode 3Lna, such that one bump 196a is used to bond the first electrode part 3Lna1 to the substrate, and the other bump 196a is used to bond the second electrode part 3Lna2 to the substrate. The cross section of each bump 196a is substantially oval. The cross sectional area 3Sna of one bump 196a is larger than the cross sectional area 3Spa of one bump 195a that is for bonding a p-electrode 3Lpa to the substrate.

The number of bumps is as follows. 17 bumps 195a are provided for the p-electrode 3Lpa. As described above, two bumps 196a are provided for the n-electrode 3Lna, so that each of the electrode parts 3Lna1 and 3Lna2 is provided with one bump 196a.

In the LED bare chip 3Da having the above structure, the n-electrode 3Lna is constituted by two electrode parts 3Lna1 and 3Lna2, where each electrode part is bonded to the substrate via a corresponding one of the bump 196a. In other words, the n-electrode 3Lna is bonded to a substrate via the plurality of bumps 196a in a plurality of positions of the substrate. Therefore, there are two bonding positions between the n-electrode 3Lna and the substrate. This structure is able to enhance the reliability of bonding force and conductivity between the electrodes 3Lna, 3Lpa and the substrate, compared to a case where there is only one bonding position.

Furthermore, suppose that the bump 196a, which is used for the electrode (i.e. n-electrode 3Lna) having a smaller bonded area with the substrate, has a cross sectional area 3Sna, and that the bump 195a, which is used for the electrode (i.e. p-electrode 3Lpa) having a larger bonded area with the substrate, has a cross sectional area 3Spa. Then, the cross sectional area 3Sna is larger than the cross sectional area 3Spa. Accordingly, the volume to be deformed when bonded is larger for the bump 196a at the side of the n-electrode 3Lna. This helps improve the reliability of bonding force and conductivity between the electrodes 3Lna and the substrate.

(B) EXAMPLE 2

Figure 17B:
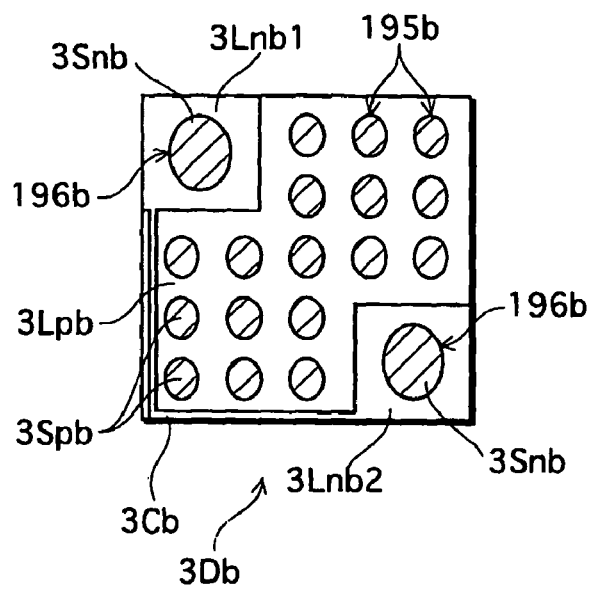

FIG. 17B shows an LED bare chip 3Db according to the example 2 of the modification example 5. As FIG. 17B shows, an n-electrode 3Lnb2 has a first electrode part 3Lnb1 and a second electrode part 2Lnb2, which are respectively and independently provided at two corners on a diagonal line of the bottom surface of the LED bare chip 3Db. The cross sectional area 3Snb of one bump 196b used for the n-electrode 3Lnb is larger than the cross sectional area 3Spb of one bump 195b used for the p-electrode 3Lpb. Even if the positions of the electrode parts 3Lnb1 and 3Lnb2 are changed from the example 1 of the modification example 5, the reliability of bonding force and conductivity between the electrode 3Lnb and the substrate is enhanced.

(C) EXAMPLE 3

Figure 17C:
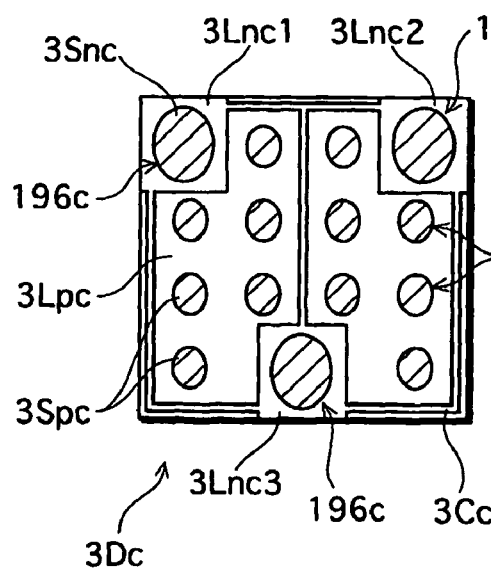

FIG. 17C shows an LED bare chip 3Dc according to the example 3 of the modification example 5. As FIG. 17C shows, an n-electrode 3Lnc has a first electrode part 3Lnc1, a second electrode part 3Lnc2, and a third electrode part 3Lnc3, which are respectively provided in separate positions from each other on the bottom surface of the LED bare chip 3Dc. In this structure, the n-electrode 3Lnc is bonded to the substrate by means of a plurality of bumps 196c respectively in separate positions, just as in the example 1. Therefore, the reliability of bonding force and conductivity between the electrode 3Lnc and the substrate is enhanced, when compared to there is only one bonding position.

Furthermore, suppose that the bump 196c, which is used for the electrode (i.e. n-electrode 3Lnc) having a smaller bonded area with the substrate, has a cross sectional area 3Snc, and that the bump 195c, which is used for the electrode (i.e. p-electrode 3Lpc) having a larger bonded area with the substrate, has a cross sectional area 3Spc. Then, the cross sectional area 3Snc is larger than the cross sectional area 3Spc. Accordingly, the volume to be deformed when bonded is larger for the bump 196c at the side of the n-electrode 3Lnc.

This helps improve the reliability of bonding force and conductivity between the electrode 3Lnc and the substrate.

(D) EXAMPLE 4

Figure 17D:
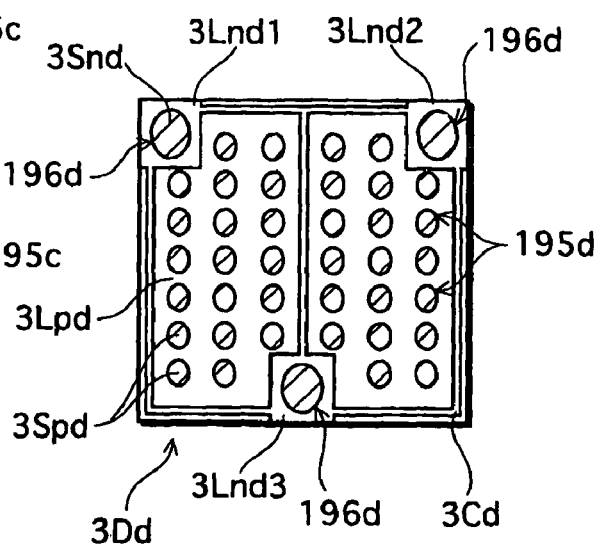

FIG. 17D shows an LED bare chip 3Dd according to the example 4 modification example 5. As FIG. 17C shows, an n-electrode 3Lnd has a first electrode part 3Lnd1, a second electrode part 3Lnd2; and a third electrode part 3Lnd3, which are respectively provided in separate positions from each other on the bottom surface of the LED bare chip 3Dc. In this structure, the n-electrode 3Lnd is bonded to the substrate by means of a plurality of bumps 196d respectively in separate positions, just as in the example 1. Therefore, the reliability of bonding force and conductivity between the electrode 3Lnd and the substrate is enhanced, when compared to there is only one bonding position.

Note that the cross sectional area 3Spd of one bump 195d used for the p-electrode 3Lpd in this example is smaller than the cross sectional area 3Spc for one bump 195c used for the p-electrode 3Lpc in the example 3. On the contrary, the number of the bumps 195d used for the p-electrode 3Lpd is greater than the number of the bumps 195c used for the p-electrode 3Lpc in the example 3.

According to the stated structure, any two adjacent bumps 195d, for bonding the p-electrode 3Lpd, have a small distance therebetween, compared to any two adjacent bumps 195c for bonding the p-electrode 3Lpc in the example 3. This helps maintain uniform heat dissipation characteristics and uniform electric current density, for the p-electrode 3Lpc.

(E) Other Notes

In the example 3 in the modification example 5, each of the electrode parts 3Lnc1, 3Lnc2, and 3Lnc3 is bonded to the substrate by means of a corresponding one of the bumps 196c. The same thing can be said to the example 4 too. However, as shown in the example 2 of the modification example 3 (FIG. 15B), two bumps 192b may be applied to one electrode part. In this case too, it is preferable that the cross sectional area of one bump is larger than the cross sectional area of one bump for a corresponding p-electrode.

For the purpose of having a larger bonding force and a reliable conductivity between the electrodes and the substrate, it is naturally preferable that more than one bump is used for each of the electrodes, and the cross sectional area of one bump is large. However, if the area of the smaller-area electrode is increased, the area of the light emitting portion of the LED bare chip accordingly decreases, which means reduction in quantity of obtained light.

Therefore, in implementation of the present invention, it is preferable to define the number, the form, and the cross sectional area of bumps, and the like, in the appropriate manner in accordance with the LED bare chip to be used (i.e. in accordance with the area of each electrode, and the like).

Note that in the modification example 5, the n-electrode 3Ln has a plurality of electrode parts, which are electrically connected to each other, by means of linking parts 3Ca, 3Cb, 3Cc, and 3Cd. However, each of the electrode parts may be provided independently, without these linking parts.

8. Lighting Apparatus

The embodiment mainly deals with a light source. However, this light source may be used as a lighting apparatus if power is supplied to the light source via a power-supply terminal and the like.

Figure 18:
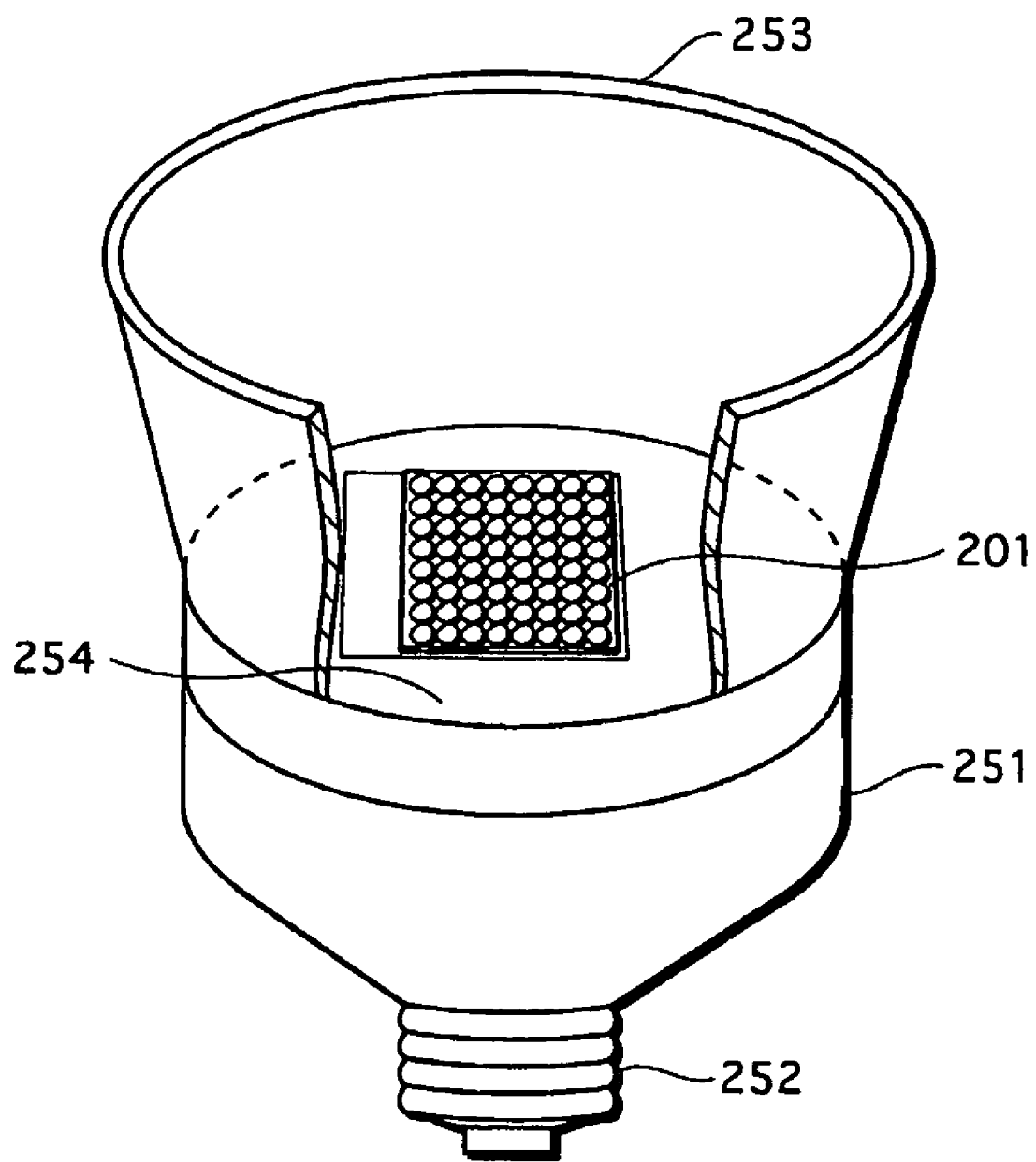
FIG. 18 is a diagram showing one example of a lighting apparatus that uses the LED light source according to the embodiment.

FIG. 18 is a diagram showing one example of a lighting apparatus that uses the LED light source according to the embodiment.

A lighting apparatus 200 has a case 251 provided with a base 252 and a reflection shade 253. A light source 201 is attached to the case 251. The base 252 is in the same standard as a base conventionally used for general incandescent lamps. The reflection shade 253 is for reflecting the light emitted from the light source 201 to the front direction.

The light source 201 is attached to a mount 254 provided in the case 251, at a side opposite to the base 252. In the case 251, a circuit for supplying power to the LED bare chips via the power-supply terminal is provided. One example of such a power supplying circuit includes: a rectifying circuit for rectifying alternating current to direct current; and a voltage adjusting circuit for adjusting a voltage value of the direct current resulting from the rectifying circuit.

9. Display Apparatus

It is possible to integrate the LED bare chips Dnm with the substrate 10 of the embodiment, into a display apparatus with 8 rows and 8 columns. In such a case, however, it becomes necessary to modify the wiring pattern so that each LED bare chip can be individually lit, and to have a publicly-known lighting control circuit or the like, so that the characters, symbols, and the like are displayed by lighting the LED bare chips individually.

Note that the display apparatus is not limited to a display apparatus with 8 rows and 8 columns. It is also possible to use the embodiment in which a plurality of LED bare chips (e.g. 64) are mounted to the substrate, as one light source of a display apparatus.

This application is based on applications No. 2004-231231 and NO. 2005-203062 filed in Japan, the contents of which are hereby incorporated by reference.

INDUSTRIAL APPLICABILITY

The present invention is applicable to a light source that hardly causes non-lighting of light emitting devices, and to a manufacturing method of the light source. The present invention is also applicable to a lighting apparatus and to a display apparatus, respectively employing the light source.

The invention claimed is:

1. A light source comprising:
at least one light emitting device, a rear surface of which is provided with two electrodes that differ from each other in area;
a substrate having conductive lands formed in correspondence with the electrodes; and
a plurality of bumps, each of which exists between a corresponding one of the electrodes and a corresponding one of the conductive lands, and has a first portion bonded to the corresponding electrode and a second portion bonded to the corresponding conductive land, wherein
the electrode being larger in area is bonded by a greater number of bumps than the electrode being smaller in area, and a bump having the smallest portion in area of all first and second portions of the plurality of bumps exists on the larger-area electrode.

2. The light source of claim 1, wherein
there is at least one bump having the largest portion in area of either the first portions or the second portions of the plurality of bumps, the either the first portions or the second portions including the smallest portion in area of all the first and second portions, and the at least one bump exists on the smaller-area electrode.

3. The light source of claim 2, wherein
at least one of first and second portions is substantially the same in area for all the bumps existing on the larger-area electrode.

4. The light source of claim 1,
only one bump exists on the smaller-area electrode.

5. The light source of claim 3,
only one bump exists on the smaller-area electrode.

6. The light source of claim 1, wherein
the bumps existing on the larger-area electrode are arranged substantially in an orderly formation.

7. The light source of claim 5, wherein
the bumps existing on the larger-area electrode are arranged substantially in an orderly formation.

8. The light source of claim 3, wherein
all the bumps existing on the larger-area electrode are the same in area within each of the first and second portions, and the largest area of all the first and second portions of the plurality of bumps is at least 1.2 times the area of one of the bumps existing on the larger-area electrode.

9. A lighting apparatus comprising a light source of claim 1.

10. A display apparatus comprising a light source of claim 1.

11. A manufacturing method of a light source, in which at least one light emitting device is mounted to conductive lands of a substrate via a plurality of bumps, the light emitting device having two electrodes on a rear surface, the electrodes differing from each other in area, wherein
the electrode being larger in area is bonded by a greater number of bumps than the electrode being smaller in area, and a bump that is bonded with an electrode and a conductive land in the smallest area among the plurality of bumps is used to bond the larger-area electrode.

12. The manufacturing method of claim 11, wherein
only one bump is used to bond the smaller-area electrode.

13. The manufacturing method of claim 11, wherein
the largest one of the bumps is used to bond the smaller-area electrode.

14. The manufacturing method of claim 12, wherein
the largest one of the bumps is used to bond the smaller-area electrode.

15. The manufacturing method of claim 12, wherein
the bumps used to bond the larger-area electrode have substantially the same size.

16. The manufacturing method of claim 14, wherein
the bumps used to bond the larger-area electrode have substantially the same size.

17. The manufacturing method of claim 12, wherein
the bumps existing on the larger-area electrode are arranged substantially in an orderly formation.

18. The manufacturing method of claim 16, wherein
the bumps existing on the larger-area electrode are arranged substantially in an orderly formation.

19. The manufacturing method of claim 12, wherein
the light emitting device is mounted to the conductive lands in ultrasound bonding, and a load exercised to the light emitting device in the ultrasound bonding increases over time.

20. The manufacturing method of claim 18, wherein
the light emitting device is mounted to the conductive lands in ultrasound bonding, and a load exercised to the light emitting device in the ultrasound bonding increases over time.

* * * * *

UNITED STATES PATENT AND TRADEMARK OFFICE
CERTIFICATE OF CORRECTION

PATENT NO. : 7,696,527 B2 Page 1 of 1
APPLICATION NO. : 11/631583
DATED : April 13, 2010
INVENTOR(S) : Uemoto et al.

It is certified that error appears in the above-identified patent and that said Letters Patent is hereby corrected as shown below:

On the Title Page:
(87)    PCT Pub. No.:    WO2006/013880 should read --WO2006/013800--.

Signed and Sealed this

Twenty-second Day of June, 2010

David J. Kappos
*Director of the United States Patent and Trademark Office*